United States Patent
Dodrill et al.

(10) Patent No.: US 9,825,636 B1
(45) Date of Patent: Nov. 21, 2017

(54) APPARATUS AND METHOD FOR REDUCED LATENCY SIGNAL SYNCHRONIZATION

(71) Applicant: ARM Limited, Cambridge (GB)

(72) Inventors: James Dennis Dodrill, Dripping Springs, TX (US); Amanda Ashley Scantlin, Buda, TX (US)

(73) Assignee: ARM Limited, Cambridge (GB)

( * ) Notice: Subject to any disclaimer, the term of this patent is extended or adjusted under 35 U.S.C. 154(b) by 0 days.

(21) Appl. No.: 15/299,016

(22) Filed: Oct. 20, 2016

(51) Int. Cl.
*H03L 7/00* (2006.01)

(52) U.S. Cl.
CPC ...................... *H03L 7/00* (2013.01)

(58) Field of Classification Search
CPC ..... G06F 1/00; G06F 1/12; G06F 1/08; G06F 1/06; H03L 7/00; H03L 7/085
USPC ........................................................ 327/145
See application file for complete search history.

(56) References Cited

U.S. PATENT DOCUMENTS

| 6,163,189 A * | 12/2000 | Ogawa | H03K 3/356156 327/201 |
| 6,236,259 B1 * | 5/2001 | Goodell | H03K 17/063 327/387 |
| 7,091,742 B2 * | 8/2006 | Ryan | H03K 3/356173 326/27 |
| 7,791,379 B1 * | 9/2010 | Bazes | H03K 5/2481 327/50 |
| 2002/0166003 A1 * | 11/2002 | Nystrom | G06F 13/14 710/18 |
| 2004/0151209 A1 * | 8/2004 | Cummings | G06F 1/12 370/503 |
| 2005/0077918 A1 * | 4/2005 | Teifel | H03K 19/17736 326/41 |
| 2007/0182423 A1 * | 8/2007 | Lewis | H03K 5/14 324/601 |
| 2008/0130396 A1 * | 6/2008 | Gomm | G11C 8/12 365/233.11 |
| 2009/0323457 A1 * | 12/2009 | Shori | G11C 7/1006 365/233.1 |
| 2010/0238843 A1 * | 9/2010 | Taghivand | H03L 7/099 370/277 |
| 2011/0018595 A1 * | 1/2011 | Sarthi | H03K 5/135 327/153 |

(Continued)

FOREIGN PATENT DOCUMENTS

GB 1452999 A * 10/1976 ............. H03K 5/133

*Primary Examiner* — Lincoln Donovan
*Assistant Examiner* — David Mattison
(74) *Attorney, Agent, or Firm* — Pramudji Law Group PLLC; Ari Pramudji

(57) ABSTRACT

An apparatus for synchronizing an input signal that is asynchronous to a clock signal received by the apparatus. The apparatus comprising selection circuitry configured to select the input signal and to generate a pair of intermediate signals associated with the selected input signal. The apparatus also comprising resolution circuitry configured to provide differential signals based on the pair of intermediate signals and to resolve meta-stability associated with the differential signals. The apparatus also comprising arbiter circuitry configured to determine a dominant value associated with the differential signals and to generate an intermediate output signal based on the determination. The apparatus further comprising latching circuitry configured to generate an output signal based on the intermediate output signal.

20 Claims, 10 Drawing Sheets

(56) References Cited

U.S. PATENT DOCUMENTS

| | | | |
|---|---|---|---|
| 2013/0069697 A1* | 3/2013 | Nunes | H03K 5/135 |
| | | | 327/142 |
| 2015/0221285 A1* | 8/2015 | Song | G09G 3/3208 |
| | | | 345/210 |
| 2016/0065133 A1* | 3/2016 | Cong | H03F 3/393 |
| | | | 600/544 |
| 2016/0072449 A1* | 3/2016 | Tajalli | H03F 1/0205 |
| | | | 330/253 |
| 2016/0118945 A1* | 4/2016 | Upputuri | G11C 7/065 |
| | | | 330/253 |
| 2017/0141803 A1* | 5/2017 | Chakraborty | H04B 1/06 |

* cited by examiner

| qhi | qlo | m0 | comment |
|---|---|---|---|
| X | X | | |
| 0 | X | | impossible |
| 0 | 1 | | |
| X | 1 | | |
| 1 | 1 | 1 | no meta-stability; high condition |
| 1 | X | 1 | meta-stability; preferred-high condition |
| 1 | 0 | * | conflict condition |
| X | 0 | 0 | meta-stability; preferred-low condition |
| 0 | 0 | 0 | no meta-stability, low condition |

APPARATUS AND METHOD FOR REDUCED LATENCY SIGNAL SYNCHRONIZATION

TECHNICAL FIELD

The present technique(s) relate to an apparatus, method, and system for signal synchronization with reduced latency.

BACKGROUND

Integrated circuit (IC) designs may have circuitry with different components that may operate and produce signals in accordance to different timing domains. For example, an IC may have components and signals that operate according to a particular clock domain while also having other components and signals that operate according to a different clock domain. In order for signals originating from one clock domain of the IC to traverse into another asynchronous clock domain of the IC, signal synchronization may be required.

Signal synchronization may utilize synchronizing flip-flops (FF's) to take an input signal (e.g., a data signal) of a first clock domain that is asynchronous to a second clock domain and generate corresponding signals that are synchronized to the second clock domain. For example, current methods for synchronization may utilize multiple stages of specially designed synchronizing flip-flops in series to achieve synchronization. However, such methods present significant design limitations. For example, there may be cases where the frequency of the receiving clock domain increases substantially. Synchronizing a signal to the higher frequency clock domain may require the use of increasing numbers of FF stages to enable adequate synchronization. Additional FF stages may also be necessary in order to meet a given Mean Time Between Failures (MTBF) signal parameter for the design. This use of ever increasing FF stages leads to increases in latency of the synchronized signals and associated data transfers which often results in diminished system performance.

Signal synchronization from one clock domain to another clock domain may also present other challenges that current synchronization methods may not address. For example, because clocks of two differing timing domains have no guaranteed relationship to one another, input signals (e.g., data signals) to be synchronized may change value (e.g., logic value) at anytime with respect to the receiving clock domain (e.g., the clock the signal is to be synchronized to). Such value changes may even occur within timing constraints of the design, such as within the window between setup and hold timing constraints. When such setup and hold timing constraints are violated by the changes in values of the input signal, the signals inside the receiving flip-flop stages may require extra time to resolve these changes and latch a stable state of the incoming data. The lack of state stability of the signal due to these changes may lead to logic failures within receiving flip-flop stages of the receiving clock domain. Current synchronization methods are limited in addressing state stability issues associated with signals that undergo a synchronization process.

Consequently, there is the need for synchronization circuitry that can provide synchronized signals with reduced latencies for clock domains with increased frequencies in a manner that utilizes minimal circuit stages. Furthermore, there is a need that such synchronization circuitry may resolve any state stability issues associated with signals to be synchronized with asynchronous clock domains in order to provide reliable stability for data states for signals undergoing signal synchronization.

BRIEF DESCRIPTION OF THE DRAWINGS

The present technique(s) will be described further, by way of example, with reference to embodiments thereof as illustrated in the accompanying drawings. It should be understood, however, that the accompanying drawings illustrate only the various implementations described herein and are not meant to limit the scope of various techniques, methods, systems, or apparatuses described herein.

FIG. 10 is a truth table illustrating exemplary outcomes associated with a synchronizing apparatus in accordance with embodiments described herein;

DETAILED DESCRIPTION

Figure 1:
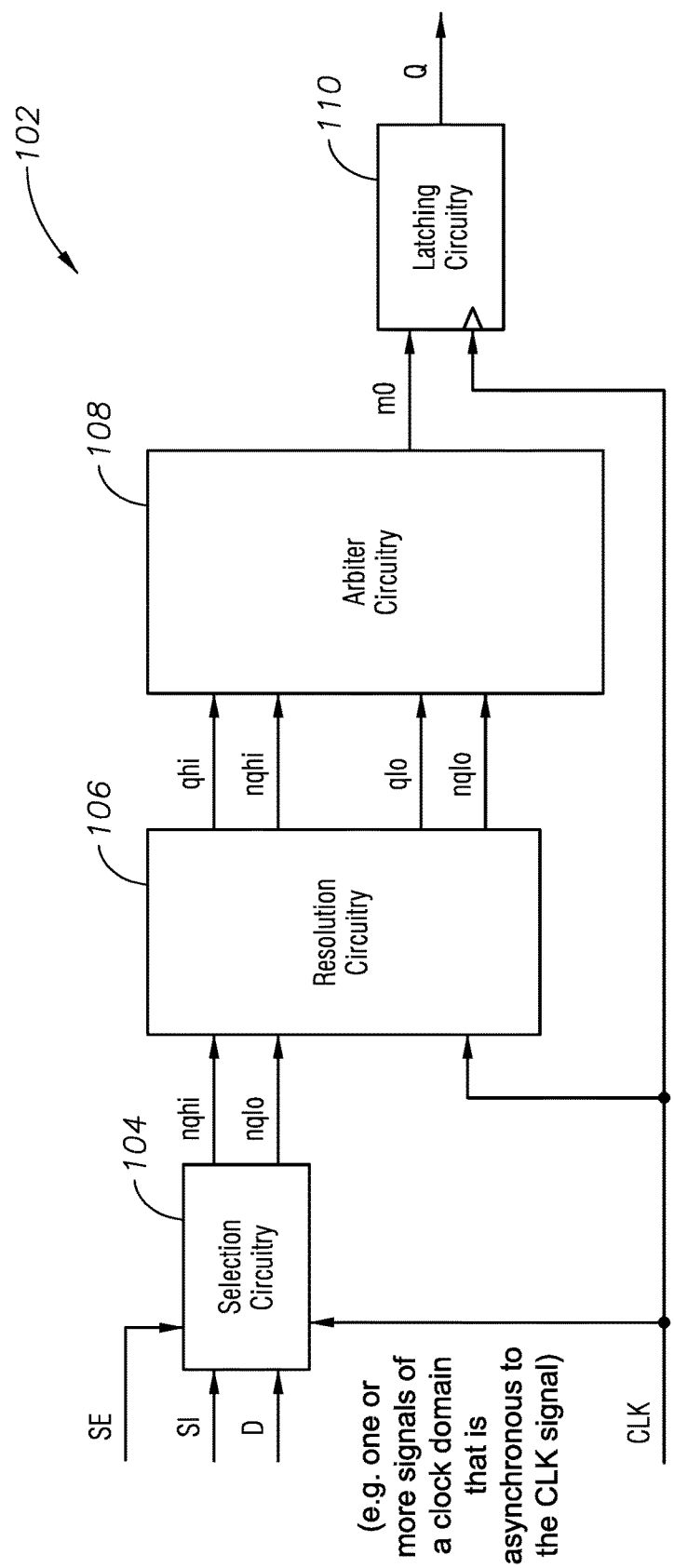
FIG. 1 is a block diagram illustrating an apparatus for synchronizing an input signal that is asynchronous to a clock signal received by the apparatus in accordance with embodiments described herein.

Before discussing the embodiments with reference to the accompanying figures, a brief description of various embodiments is provided.

In one embodiment, an apparatus for synchronizing an input signal that is asynchronous to a clock signal received by the apparatus is described herein. The apparatus includes selection circuitry configured to select the input signal and to generate a pair of intermediate signals associated with the selected input signal. The apparatus also includes resolution circuitry configured to provide differential signals based on the pair of intermediate signals and to resolve meta-stability associated with the differential signals. The apparatus also includes arbiter circuitry configured to determine a dominant value associated with the differential signals and to generate an intermediate output signal based on the determination. The apparatus further includes latching circuitry configured to generate an output signal based on the intermediate output signal.

In another embodiment, a method for synchronizing an input signal of a first clock domain that is asynchronous to a clock signal of a second clock domain is described herein. The method includes generating a pair of intermediate signals based on selection of the input signal. The method also includes providing differential signals based on the pair of intermediate signals. Providing the differential signals includes resolving meta-stability associated with the differential signals. The method also includes generating an intermediate output signal based on determining a dominant value associated with the differential signals. The method further includes generating an output signal based on the intermediate output signal In another embodiment, there is provided a system for synchronizing an input signal of a first clock domain that is asynchronous to a clock signal of a second clock domain as described herein. The system includes means for generating a pair of intermediate signals. The means for generating the pair of intermediate signals enables selection of the input signal. The system also includes means for providing differential signals based on the pair of intermediate signals. The means for providing the differential signals resolves meta-stability associated with the differential signals. The system also includes means for generating an intermediate output signal based on the means for generating the intermediate output signal determining a dominant value associated with the differential signals. The system further includes means for generating an output signal based on the intermediate output signal.

An integrated circuit (IC) may comprise various components (e.g., functional blocks) that process various signals. Each of the signals may be subject to different timing clocks that are associated with different timing domains of the IC. The communication/exchange of signals between different timing domains (e.g., clock domains) may require signal synchronization where input signals associated with a first clock domain are synchronized to a second clock domain. Such synchronization may be limited by the ability of synchronization circuitry to achieve stable states for input data synchronization. For example, two differing clock domains may have no guaranteed relationship to one another. As a result, input signals (e.g., data signals) to be synchronized may change value (e.g., logic value) at anytime with respect to a receiving clock domain to which the input signals are to be synchronized. The changing values may lead to state instability. The lack of stability for the state of the signal due to these changes or other conditions may be referred to herein as meta-stability. Such meta-stability associated with the signals may lead to logic failures within receiving flip-flop stages of current synchronization circuitry of the receiving clock domain. Current synchronization circuitry and methods are limited in addressing meta-stability and may be susceptible to logic errors associated with data state instability. The apparatuses and methods described herein may mitigate the occurrence of meta-stability for signal states to ensure the processing of stable states during the signal synchronizations. Accordingly, the apparatuses and methods described herein may be integrated with the components of an IC to provide circuitry that resolves meta-stability associated with input signals as a part of the synchronizing of the input signal of a first clock domain that is asynchronous to a clock signal of a second clock domain.

Such apparatuses and methods may improve the reliability and integrity of input signals being synchronized. Additionally, it would be advantageous to provide an apparatus and method that provides reduced latencies for signals synchronized to asynchronous clock domains (e.g., higher or lower frequency clock domains) and to achieve this while reducing circuit stages of the synchronizing circuitry. For example, in a non-limiting embodiment, an apparatus may be configured to receive an input signal (e.g., a data signal) that is asynchronous to a clock associated with the apparatus, resolve any meta-stability associated with the input signal, and provide a synchronized signal with stable data within a reduced number of clock phases where the apparatus utilizes a reduced number circuit stages (e.g., reduced number of FF stages) for signal synchronization.

In these ways, the apparatuses described herein can provide reduced latencies for signals synchronized to asynchronous clock domains while reducing circuit stages of the synchronizing circuitry. In this manner, the apparatuses and associated methods described herein may improve signal stability during synchronization and reduce synchronization latencies to enable improved system performance with reduced associated errors. Additionally, by utilizing reduced number circuit stages (e.g., FF stages) for signal synchronization involving asynchronous clock domains (e.g., higher or lower frequency clock domains), the apparatuses and associated methods described herein may enable a reduction in component area usage and their associated costs for IC designs. Furthermore, the apparatuses and associated methods described herein may reduce the complexity and resource usage for synchronization circuitry, to enable increased efficiency of a design process and/or design flow for IC's utilizing signal synchronization circuitry.

The apparatuses and methods described herein may be process independent such that they may be applied to various process technologies. For example, the apparatuses and methods may be applied to current process technologies and any future process technologies having reduced process geometries (e.g., such as 16 nm or smaller geometry processes). Additionally, the apparatuses and methods may be the result of or associated with various lithographic techniques such as, but not limited to, extreme ultra violet lithography, nanoimprint lithography, multiple patterning lithography, magneto lithography, and various chemical lithography. The apparatuses and methods described herein may be applied to process technologies that implement various types of devices such as, but not limited to, planar devices, multi-gate devices, or a combination of both. For example, the apparatuses and methods described herein may be applied to or implemented using various FinFET device technologies, such as, but not limited to, FinFET compact (FFC) or FinFET plus (FF+) technologies associated with a process technology.

The apparatuses and methods described herein may be associated with one or more standard cells (e.g., a standard cell library) of a process technology so as to enable the automated design of an integrated circuit (IC) with signal synchronization capability. To illustrate, a standard design flow may provide netlists (e.g., schematic level and/or layout level netlists) that include the apparatuses used for synchronizing an input signal of a first clock domain that is asynchronous to a clock signal of a second clock domain (e.g., an input signal that is asynchronous to a clock signal received by an apparatus of the second clock domain). Such netlists may be associated with modules (e.g., synchronization modules, power management modules, signal management modules, etc.) of the IC design. Alternatively or in addition, the apparatuses and methods described herein may be associated with one or more engineering change order (ECO) steps used to make changes to a standard design flow. For example, a standard design flow may be modified utilizing ECO steps to provide modified netlists that include the apparatuses and methods used for the signal synchronization described herein.

Particular embodiments will now be described with reference to the figures.

Referring to FIG. 1, a block diagram schematically illustrating an apparatus for synchronizing an input signal that is asynchronous to a clock signal received by the apparatus is shown and generally designated 102. The apparatus 102 may include selection circuitry 104, resolution circuitry 106, arbiter circuitry 108, and latching circuitry 110. The apparatus 102 may enable an input signal (e.g., input signal D or SI of a first clock domain) that is asynchronous to a clock signal of a second clock domain to be synchronized to the clock signal of a second clock domain for generation of a corresponding output signal (e.g., output signal Q) of the second clock domain.

The selection circuitry 104 may be configured to select the input signal (e.g., input signal D or input signal SI) based on an enable signal (e.g., signal SE) and a clock signal (e.g., signal CLK) received by the selection circuitry 104 of the apparatus 102. The clock signal associated with a second clock domain and the input signal associated with a first clock domain which is asynchronous to the clock (e.g., signal CLK) of the second clock domain. The selection circuitry 104 may be further configured to provide a pair of intermediate signals (e.g., signals nqhi and nqlo) associated with the selected input signal. For example, selection circuitry 104 may be coupled to the resolution circuitry 106. The selection circuitry 104 may receive one or more input signals (e.g., input signal D or input signal SI), the enable signal (e.g., signal SE) and the clock signal (e.g., signal CLK) and based on the logic values (and corresponding voltage values) of the input, enable, and clock signals, the selection circuitry 104 may select an input signal and provide the pair of intermediate signals (e.g., signals nqhi and nqlo) corresponding to the selected input signal. The selection circuitry 104 may drive the pair of intermediate signals (e.g., signals nqhi and nqlo) to be received by the resolution circuitry 106. In a particular embodiment, the selection circuitry 104 may be coupled to the resolution circuitry 106 but may be located outside of the apparatus 102 and within the second clock domain of the apparatus 102. In another embodiment, the selection circuitry 104 may be configured to operate in a non-scan mode (e.g., removal of input signal SI) so as to always select the input signal D. In another embodiment, the selection circuitry 104 may be comprised of a multiplexer circuitry. In yet another embodiment, the selection circuitry 104 may incorporate multiplexer circuitry with other circuit elements (e.g., pass gate circuitry).

The resolution circuitry 106 may be configured generate differential signals (e.g., signals qhi, nqhi, qlo, and nqlo) based on the pair of intermediate signals (e.g., signals nqhi and nqlo) and the clock signal (e.g., signal CLK, of the second clock domain). For example, the resolution circuitry 106 may be coupled to the selection circuitry 104 and may be coupled to the arbiter circuitry 108. The resolution circuitry 106 may receive the pair of intermediate signals (e.g., signals nqhi and nqlo) and based on the logic value (and corresponding voltage value) of the clock signal (e.g., CLK), the resolution circuitry 106 may generate the differential signals (e.g., signals qhi, nqhi, qlo, and nqlo). As part of generating the differential signals, the resolution circuitry 106 may resolve any meta-stability associated with the differential signals. For example, during synchronization of an input signal, the selected input signal (e.g., data signal D) that is associated with a first clock, may change value (e.g., logic value) at anytime with respect to the receiving second clock domain to which the input signal is to be synchronized. The changing values may lead to meta-stable states (e.g., state instability) for the differential signals that correspond to the received pair of intermediate signals. Accordingly, the differential signals may be associated with a stable state (e.g., a stable high or low logic state) or with meta-stable state (e.g., instable, unresolved state). In a particular embodiment, the resolution circuitry 106 may utilize tuned latches to resolve the meta-stability so as to enable the generation of the differential signals with stable states. In a particular embodiment, the resolution of meta-stability and generation of stable state differential signals by the tuned latches may occur at different times. For example, one tuned latch may resolve faster than another tuned latch. The resolution circuitry 106 may drive the differential signals to be received by the arbiter circuitry 108.

The arbiter circuitry 108 may be configured to generate an intermediate output signal (e.g., signal m0) based on a determination of a dominant value associated with the generated differential signals (e.g., signals qhi, nqhi, qlo, and nqlo). For example, the arbiter circuitry 108 may be coupled to the resolution circuitry 106 and coupled to the latching circuitry 110. The arbiter circuitry 108 may receive the differential signals generate by the resolution circuitry 106. Based on the logic values (and corresponding voltage values) of the differential signals and the determination of a dominant value associated with the generated differential signals, the arbiter circuitry 108 may generate the intermediate output signal (e.g., signal m0). To illustrate, the resolution circuitry 106 may provide to the arbiter circuitry 108 differential signals having logic values that correspond to different state conditions. The determination of the dominant value by the arbiter circuitry 108 may include evaluating and processing the different state conditions associated with the differential signals. The state conditions that may be evaluated include a high condition, a low condition, a preferred-high condition, a preferred-low condition, and a conflict condition. The determination of the dominant value by the arbiter circuitry 108 may include the arbiter circuitry 108 selecting a value from one of the tuned latches of the resolution circuitry 106 based on the first (e.g., faster) tuned latch to resolve a stable differential signal. The determined dominant value may be a logic low value or a logic high value. In this manner, the dominant value may be the value of the latch which resolves first where the arbiter circuitry 108 rejects any further value change regardless of the value of the latch which resolves second. In a particular embodiment, the determination of the dominant value may be based on a resolution time parameter associated with the resolution circuitry 106. The arbiter circuitry 108 may subsequently drive the generated intermediate output signal (e.g., signal m0) to be received by the latching circuitry 110. In a particular embodiment, the arbiter circuitry 108 may include a differential amplifier configured to receive the differential signals generated by the resolution circuitry 106.

The latching circuitry 110 may be configured to generate an output signal (e.g., output signal Q) based on the intermediate output signal (e.g., signal m0) and based on the clock signal (e.g., signal CLK). For example, the latching circuitry 110 may be coupled to the arbiter circuitry 108 to receive the intermediate output signal. The latching circuitry 110 may also receive a clock signal (e.g., the signal CLK, of the second clock domain) and based on a rising edge of the clock signal and the voltage value (and corresponding logic value) of the intermediate output signal, the latching circuitry 110 may generate the output signal (e.g., signal Q) that is synchronous with the clock signal of the second clock domain. In a particular embodiment, the latching circuitry 110 may be comprised of a D-latch, or a master-slave latch, or any other form of latching circuitry.

During operation, the apparatus 102 may provide signal synchronization in which an input signal of a first clock domain is transformed to an output signal synchronized to a second clock domain (e.g., a clock domain of the apparatus). For example, for a particular clock phase, the selection circuitry 104 may receive input signals (e.g., input signal D or input signal SI) and based on the enable signal (e.g., signal SE) and the clock signal (e.g., signal CLK, of the second clock domain) the selection circuitry 104 will select an input signal. In cases where the enable signal SE has a logic high value (e.g., a logic 1), the input signal SI is selected. In cases where the enable signal SE has a logic low value (e.g., a logic 0), the input signal D is selected. Based on the selection, a pair of intermediate signals (e.g., signals nqhi and nqlo) are provided by the selection circuitry 104 to be received by the resolution circuitry 106. When the clock signal has a logic low value, the resolution circuitry 106 may capture the pair of intermediate signals corresponding to the selected input signal. While the clock signal has logic low value, the resolution circuitry 106 may resolve any meta-stability associated with the differential signals to be provided. Meta-stability resolution may be accomplished with the use of tuned latches of the resolution circuitry 106. In a particular embodiment, the capture of the pair of intermediate signals may occur on a falling edge of the clock signal and subsequent meta-stability resolution and providing of the differential signals may occur while the clock signal maintains the logic low value. While the clock signal has logic low value, the arbiter circuitry 108 may determine a dominant value associated with the differential signals (e.g., signals qhi, nqhi, qlo, and nqlo) and based on the determination may generate an intermediate output signal (e.g., signal m0). The generated intermediate output signal may have a value that represents the next output value for a generated output signal (e.g., output signal Q). Subsequently, when the clock signal begins to rise (e.g., a rising clock edge of the signal CLK) the generated intermediate output signal may be transferred to (captured by) the latching circuitry 110 for generating the output signal (e.g., output signal Q). The generated output signal corresponding to the selected input signal may be synchronous with the clock signal (CLK) of the apparatus 102 (e.g., associated with the second clock domain). The output signal (e.g., Q) may be driven by the latching circuitry 110 to be received by further circuitry (e.g., circuitry of the second clock domain or other clock domains).

In this manner, the apparatus 102 may enable the capture of a data input signal on a falling edge of the clock signal of the apparatus 102 (e.g., a second clock domain), the resolution of any meta-stability within a half clock phase, and provide a synchronized data output signal that may be available for use on the next rising edge of the clock signal of the apparatus 102. In a particular embodiment, the apparatus 102 may resolve meta-stability associated with synchronization within a reduced latency period. Such reduced latency may occur in cases where the clock signal (e.g., CLK) of the apparatus 102 is a high frequency asynchronous clock signal. In another embodiment, the apparatus 102 may be configured to have a minimal number of FF stages for generation of signals synchronized to a high frequency asynchronous clock signal (e.g., clock signal of the second clock domain). For example, the apparatus 102 may synchronize signals to various high frequency asynchronous clock domains without the use of any additional component stages (e.g., added FF stages). In these ways, the apparatus 102 may provide a synchronizing circuitry with reduced circuit stages that may reduce latency periods for signals synchronized to higher frequency asynchronous clock domains. Furthermore, the apparatus 102 may improve signal stability as part of the synchronization of signals to other clock domains with reduce synchronization latencies so as to minimize any performance penalty associated with signal synchronization and the transferring of data input signals between asynchronous clock domains.

Figure 2:
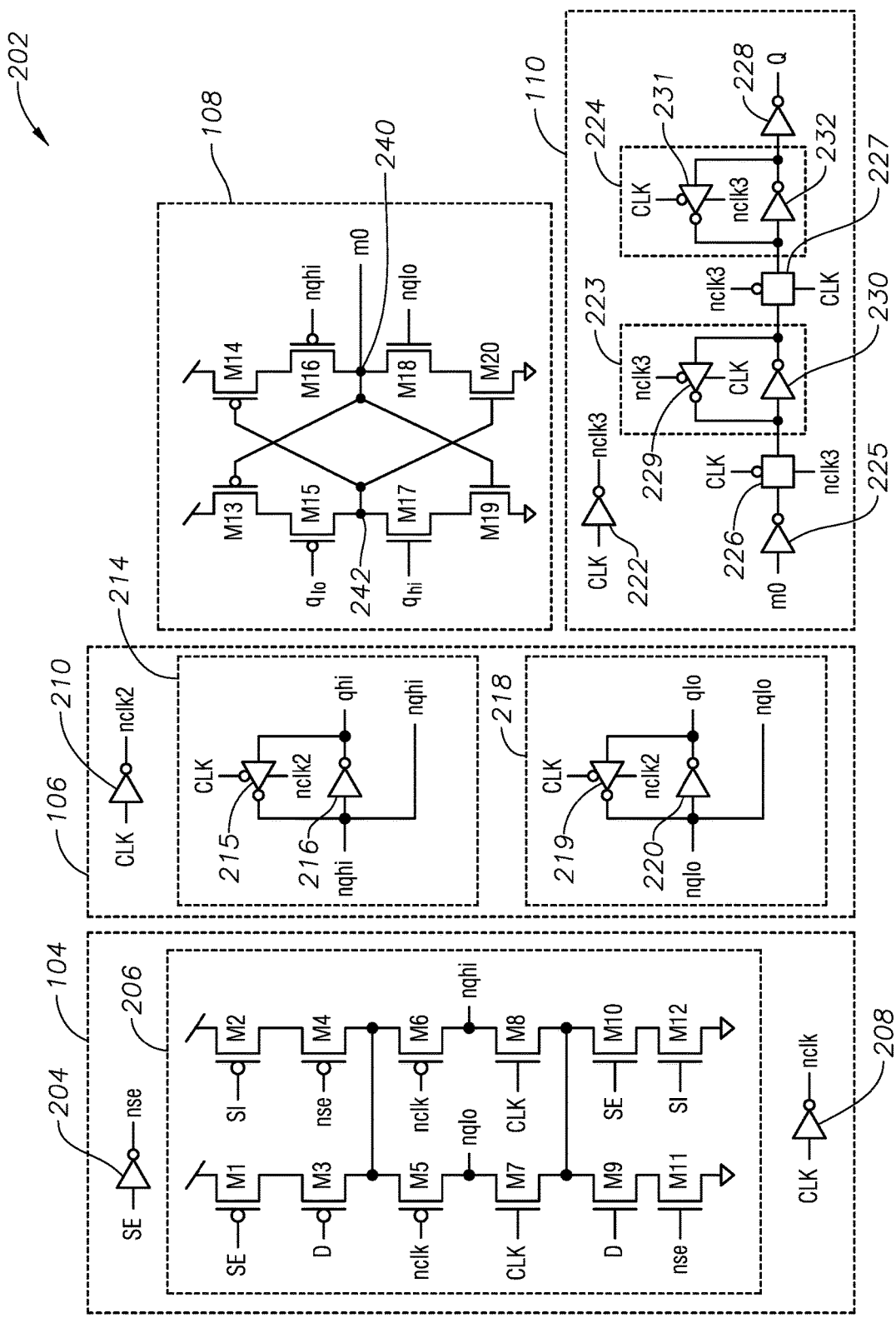
FIG. 2 is a circuit diagram schematically illustrating an apparatus for synchronizing an input signal that is asynchronous to a clock signal received by the apparatus in accordance with embodiments described herein.

Referring to FIG. 2, a circuit diagram schematically illustrating an exemplary design of an apparatus for synchronizing an input signal that is asynchronous to a clock signal received by the apparatus is shown and generally designated 202. The apparatus 202 includes a power supply (e.g., VDD) and a grounding power supply (e.g., VSS) rails of a voltage domain in which the apparatus 202 is located. The apparatus 202 may be the apparatus 102 of FIG. 1 and may have substantially the same signals, operations, and/or configurations as described for the apparatus 102 of FIG. 1. For example, the apparatus 202 may include the selection circuitry 104, the resolution circuitry 106, the arbiter circuitry 108, and the latching circuitry 110 as depicted with exemplary circuit devices. The apparatus 202 may enable an input signal (e.g., of a first clock domain) that is asynchronous to a clock signal (e.g., CLK) of a second clock domain to be synchronized to the clock signal for generation of a corresponding output signal (e.g., output signal Q) of the second clock domain. In another embodiment, the apparatus 202 may be part of a standard cell library of a process technology associated with an IC.

The selection circuitry 104 may include an inverter 204, an inverter 208 and input circuitry 206. The selection circuitry 104 includes power supply (e.g., VDD) and a grounding power supply (e.g., VSS) rails (e.g., shown for 206, not shown for 204 or 208) of a voltage domain of the apparatus 202. The inverter 204 may receive an enable signal (e.g., signal SE) and generate an inverse enable signal (e.g., signal nse). The inverter 208 may receive a clock signal (e.g., signal CLK of a second clock domain) and generate an inverse clock signal (e.g., signal nclk). In one embodiment, the input circuitry 206 may comprise multiplexer circuitry coupled to one or more separate transmission gate circuitries. In a particular embodiment, the input circuitry 206 may be a condensed multiplexer-gate circuitry that is comprised of PMOS and NMOS transistors (e.g., transistors M1-M6 and M7-M12, respectively) configured as depicted in FIG. 2. The input circuitry 206 may receive input signals (e.g., signals SI, D), clock signals (e.g., CLK, and nclk), and enable signals (e.g., SE, and nse) so as to provide of a pair of intermediate signals (e.g., signals nqhi and nqlo) that may be received by the resolution circuitry 106. The pair of intermediate signals may have complementary logic values that correspond to the selected input signal. In a particular embodiment, the inverter 204 and/or the inverter 208 may be located outside of the selection circuitry 104 for generation of their inverse signals (e.g., nse and nclk, respectively). The selection circuitry 104 may have substantially the same signals, operations, timing, and/or configurations as described for the selection circuitry 104 of FIG. 1.

The resolution circuitry 106 may be configured to provide differential signals based on the pair of intermediate signals. The resolution circuitry 106 may include an inverter 210, a first latch (e.g., a high-tuned latch) 214, and a second latch (e.g., a low-tuned latch) 218. The resolution circuitry 106 includes power supply (e.g., VDD) and a grounding power supply (e.g., VSS) rails (not shown) of a voltage domain of the apparatus 202. The inverter 210 may receive a clock signal (e.g., signal CLK of a second clock domain) and generate an inverse clock signal (e.g., signal nclk2). The clock signal (e.g., CLK) and inverse clock signal (e.g., nclk2) may be received by the high-tuned latch 214 and the low-tuned latch 218. In one embodiment, the first latch may be preferably tuned to generate a logical high value associated with the differential signals and the second latch may be preferably tuned to generate a logical low value associated with the differential signals.

To illustrate, the high-tuned latch 214 (e.g., the first latch) may include a first tri-state inverter 215 and a first inverter 216. The first tri-state inverter 215 and the first inverter 216 may be configured such that the input of each is coupled to the output of the other so that they form a pair of cross-coupled inverters. The cross-coupled pair (first tri-state inverter 215 and first inverter 216) may receive the intermediate signal nqhi and may provide the differential signal qhi. The high-tuned latch 214 may resolve any meta-stability associated with the differential signal qhi so as to provide the differential signal qhi with a stable state. The high-tuned latch 214 may include PMOS and NMOS transistors that are preferentially tuned to favor resolving to a logical high value. The preferential tuning may be based on different sizing of one or more PMOS and one or more NMOS transistors. For example, the first inverter 216 may include a PMOS transistor that is sized larger than a PMOS transistor of the first tri-state inverter. The first inverter 216 may also include an NMOS transistor that is sized smaller than an NMOS transistor of the first tri-state inverter. In this manner, the high-tuned latch 214 may provide the differential signal qhi and resolve any meta-stability associated with the differential signal qhi.

Additionally, the low-tuned latch 218 (e.g., the second latch) may include a second tri-state inverter 219 and a second inverter 220. The second tri-state inverter 219 and the second inverter 220 may be configured such that the input of each is coupled to the output of the other so that they form another pair of cross-coupled inverters. The cross-coupled pair (second tri-state inverter 219 and second inverter 220) may receive the intermediate signal nqlo and may provide the differential signal qlo. The low-tuned latch 218 may resolve any meta-stability associated with the differential signal qlo so as to provide the differential signal qlo with a stable state. The low-tuned latch 218 may include PMOS and NMOS transistors that are preferentially tuned to favor resolving to a logical low value. The preferential tuning may be based on different sizing of one or more PMOS and one or more NMOS transistors. For example, the second inverter 220 may include a PMOS transistor that is sized smaller than a PMOS transistor of the second tri-state inverter. The second inverter 220 may also include an NMOS transistor that is sized larger than an NMOS transistor of the second tri-state inverter 219. In this manner, the low-tuned latch 218 may provide the differential signal qlo and resolve any meta-stability associated with the differential signal qlo.

In a particular embodiment, the first latch (e.g., the high-tuned latch 214) and the second latch (e.g., the low-tuned latch 218) are enabled based on a falling edge of the clock signal (e.g., signal CLK) received by the resolution circuitry 106. In this manner, the first and second latches may capture data associated with a selected input signal at the same time. As a result, a transition time associated with the input signal may not affect the synchronizing operation of the apparatus 201. Furthermore, the first and second latches may not be meta-stable at the same time when capturing data at the same time. In a particular embodiment, the inverter 210 may be located outside of the resolution circuitry 106 to generate the inverse signal (e.g., nclk2). The resolution circuitry 106 may have substantially the same signals, operations, timing, and/or configurations as described for the resolution circuitry 106 of FIG. 1.

The arbiter circuitry 108 may be comprised of PMOS and NMOS transistors (e.g., transistors M13-M16 and M17-M20, respectively) configured to form a differential amplifier as depicted in FIG. 2. The differential amplifier may be configured to receive the differential signals provided by the resolution circuitry 106. The arbiter circuitry 108 may include power supply (e.g., VDD) and a grounding power supply (e.g., VSS) rails (shown) of a voltage domain of the apparatus 202. The differential amplifier of the arbiter circuitry 108 may include a first pair of complementary transistors (e.g., transistors M13 and M19), a second pair of complementary transistors (e.g., transistors M16 and M18), a third pair of complementary transistors (e.g., transistors M14 and M20), and a fourth pair of complementary transistors (e.g., transistors M15 and M17). In a particular embodiment, the first pair and second pair of complementary transistors share a first common node 240, and the third pair and fourth pair of complementary transistors share a second common node 242.

The arbiter circuitry 108 may be configured to determine a dominant value associated with the differential signals and based on this determination may generate the intermediate output signal (e.g., signal m0). For example, the arbiter circuitry 108 may receive the differential signals which may have logic values that correspond to different state conditions. To illustrate, the resolution circuitry 106 may resolve meta-stability as part of providing the differential signals qhi, nqhi, qlo, and nqlo. The logic values of the differential signals (e.g., qhi, qlo, nqhi, and nqlo) may be associated with different state conditions that include a high condition, a low condition, a preferred-high condition, a preferred-low condition, and a conflict condition. The arbiter circuitry 108 may evaluate and process the different state conditions presented by the logic values of the differential signals as part of determining the dominant value used to generate the intermediate output signal (e.g., signal m0). The determined dominant value may be a logic low value or a logic high value. Evaluation of a particular state condition presented to the arbiter circuitry 108 by the logic values of the resolution circuitry 106 may be according to the exemplary outcomes of the arbiter circuitry 108 as described with reference to FIG. 10. The intermediate output signal (e.g., signal m0) generated by the arbiter circuitry 108 may be synchronized to the clock signal (e.g., CLK signal of the second clock domain) of the apparatus 202. The intermediate output signal (m0) may correspond to the selected input signal (e.g., a selected data signal D). The arbiter circuitry 108 may have substantially the same signals, operations, timing, and/or configurations as described for the arbiter circuitry 108 of FIG. 1.

The latching circuitry 110 may include power supply (e.g., VDD) and grounding power supply (e.g., VSS) rails (not shown) of a voltage domain of the apparatus 202. In one embodiment, the latching circuitry 110 may comprise one or more clocked D flip-flops. In a particular embodiment, the latching circuitry 110 may include an inverter 222, an input inverter 225, a first transmission gate 226, a master latch 223, a second transmission gate 227, a slave latch 224, and an output inverter 228. The inverter 222 may receive a clock signal (e.g., signal CLK of a second clock domain) and generate an inverse clock signal (e.g., signal nclk3).

The master latch 223 may include a tri-state inverter 229 and another inverter 230. The tri-state inverter 229 and the inverter 230 may be configured such that the input of each is coupled to the output of the other so that they form a pair of cross-coupled inverters. The slave latch 224 may include a tri-state inverter 231 and another inverter 232. The tri-state inverter 231 and the inverter 232 may also be configured such that the input of each is coupled to the output of the other so that they also form a pair of cross-coupled inverters. The tri-state inverter 229 may be configured to receive the clock signal (e.g., CLK) and the inverse clock signal (e.g., signal nclk3). The tri-state inverter 231 may be configured to receive the clock signal and the inverse clock signal in a manner that is opposite (e.g., complementary to) how the tri-state inverter 229 receives the clock signal and the inverse clock signal.

The latching circuitry 110 may receive (via the input inverter 225) the intermediate output signal (e.g., signal m0) and based on a rising edge of the clock signal (e.g., the signal CLK, of the second clock domain) and the voltage value (and corresponding logic value) of the intermediate output signal, the latching circuitry 110 may generate the output signal (e.g., signal Q) that is synchronous with the clock signal of the second clock domain. The output signal (Q) may be driven by the output inverter 228. The generated output signal may have a logic value that corresponds to the logic value of the selected input signal. In a particular embodiment, the inverter 222 may be located outside of the latching circuitry 110 to generate the inverse signal (e.g., nclk3). The latching circuitry 110 may have substantially the same signals, operations, timing, and/or configurations as described for the latching circuitry 110 of FIG. 1.

The apparatus 202 may resolve meta-stability associated with synchronization within a reduced latency period in a manner substantially the same that described for the apparatus 102 of FIG. 1. Similarly, the apparatus 202 may be configured to have a minimal number of FF stages for generation of signals synchronized to an asynchronous clock signal (e.g., high frequency clock signal of the second clock domain). In these ways, an apparatus 202 may provide reduced latencies for signal synchronization while utilizing a reduced number of circuit stages to enable improve signal stability during synchronization and reduce synchronization latencies in a manner substantially the same as that described for the apparatus 102 of FIG. 1.

Referring to FIG. 10, a truth table illustrating exemplary outcomes associated with a synchronizing apparatus is shown and generally designated T100. The table T100 illustrates the potential outcomes associated with the differential signals (e.g., signals qhi and qlo) as provided by the resolution circuitry 106 and illustrates the potential corresponding outcomes associated with the intermediate output signal (e.g., signal m0) as provided by the arbiter circuitry 108. For the differential signals qhi and qlo, the potential outcome states may include a logic high state (e.g., 1), a logic low state (e.g., 0), or an unresolved meta-stable state (e.g., X). Some cases of the potential outcome states are deemed unlikely or impossible as a result of the operations of the tuned latches (e.g., the high-tuned latch 214 and low-tuned latch 218). For example, the high-tuned latch 214 is preferably tuned to generate logic high values which would preclude logic low values for the differential signal qhi, making the cases T102 and T103 unlikely or impossible. Similarly, the low-tuned latch 218 is preferably tuned to generate logic low values which would preclude logic high values for the differential signal qlo, making the cases T103 and T104 unlikely or impossible. Under normal operations, at least one of the tuned latches will resolve to generate an outcome state (e.g., a logic state for a generated differential signal) making the case T101 (e.g., all meta-stable states) unlikely or impossible.

The two cases T105 and T109 may be associated with little or no meta-stability for the potential outcome states of the differential signals qhi and qlo. For the case T105, the resolution circuitry 106 may resolve to provide logic high states (e.g., 1) for both qhi and qlo signals, which may present a high state condition to the arbiter circuitry 108 for dominant value determination. For this case, the arbiter circuitry 108 may determine a high dominant value (e.g., logic high value) for generation of the intermediate output signal (e.g., signal m0) with a logic high value (e.g., logic 1). For the case T109, the resolution circuitry 106 may resolve to provide logic low states (e.g., 0) for both qhi and qlo signals, which may present a low state condition to the arbiter circuitry 108 for dominant value determination. For this case, the arbiter circuitry 108 may determine a low dominant value (e.g., logic low value) for generation of the intermediate output signal (e.g., signal m0) with a logic low value (e.g., 0).

The two cases T106 and T108 may be associated with one of the differential signals, qhi or qlo, having meta-stability (e.g., a meta-stable state X) for its potential outcome state. For the case T106, the resolution circuitry 106 may resolve to provide the logic high state (e.g., 1) for the qhi signal before resolving a logic state for the qlo signal, resulting in an unresolved meta-stable state (X) for the qlo signal. In this case, the meta-stable state of the qlo signal may resolve to a same state of qhi (e.g., solid arrow) or may resolve to a conflict state with qhi (e.g., dashed arrow). The T106 case may present a preferred-high state condition to the arbiter circuitry 108 for dominant value determination. For this case, the arbiter circuitry 108 may determine a high dominant value (e.g., logic high value) for generation of the intermediate output signal (e.g., signal m0) with a logic high value (e.g., 1).

For the case T108, the resolution circuitry 106 may resolve to provide the logic low state (e.g., 0) for the qlo signal before resolving a logic state for the qhi signal, resulting in an unresolved meta-stable state (X) for the qhi signal. In this case, the meta-stable state of the qhi signal may resolve to a same state of qlo (e.g., solid arrow) or may resolve to a conflict state with qlo (e.g., dashed arrow). The T108 case may present a preferred-low state condition to the arbiter circuitry 108 for dominant value determination. For this case, the arbiter circuitry 108 may determine a low dominant value (e.g., logic low value) for generation of the intermediate output signal (e.g., signal m0) with a logic low value (e.g., 0).

For the case T107, the resolution circuitry 106 may resolve to generate the logic high state (e.g., 0) for the qhi signal and may generate the logic low state (e.g., 0) for the qlo signal at or about the same time. This may result in stable but complementary states for the qhi and qlo signals. Such a case may present a conflict state condition to the arbiter circuitry 108 for dominant value determination. For this case, the arbiter circuitry 108 may determine a same dominant value for generation of the intermediate output signal (e.g., signal m0). The generated intermediate output signal having a value that retains the previous logic value (denoted as an asterisk (*) and which may be either a logic high value or a logic low value) of the intermediate output signal (e.g., m0). In a particular embodiment, for the conflict state condition, the arbiter circuitry 108 may generate the intermediate output signal (e.g., m0) having a value that is later resolved (i.e., a next resolve value). In another embodiment, for the conflict state condition, the arbiter circuitry 108 may generate the intermediate output signal (e.g., m0) having a value of the tuned latch that resolves first. In yet another embodiment, for the conflict state condition, the arbiter circuitry 108 may generate the intermediate output signal (e.g., m0) having a preselected value. The arbiter circuitry 108 may evaluate and process the different state conditions presented by the logic values of the differential signals as part of determining the dominant value used for the generation of the intermediate output signal (e.g., signal m0). Such generation may be in accordance with the potential outcomes exemplified in table T100.

Figure 3:
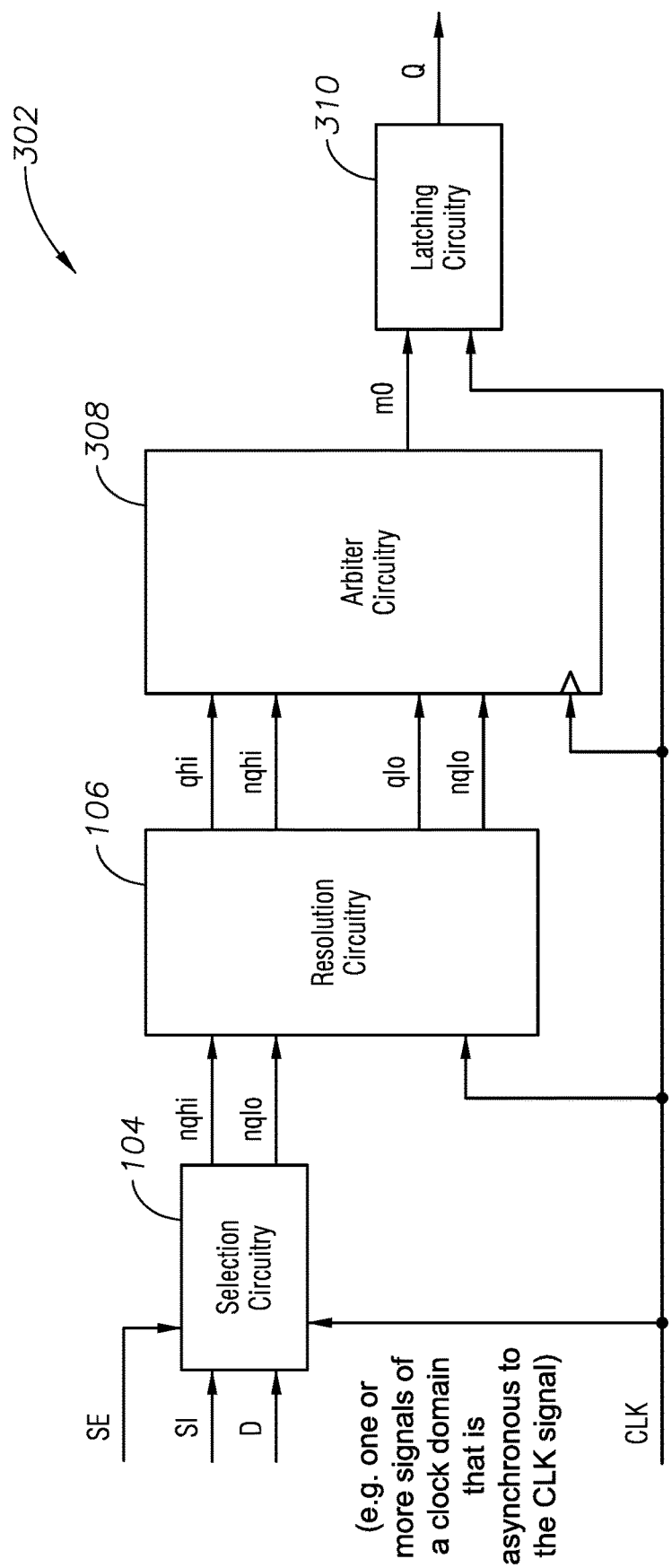
FIG. 3 is a block diagram illustrating an apparatus for synchronizing an input signal that is asynchronous to a clock signal received by the apparatus in accordance with another embodiment described herein.

Referring to FIG. 3, a block diagram schematically illustrating an apparatus for synchronizing an input signal that is asynchronous to a clock signal received by the apparatus is shown and generally designated 302. The apparatus 302 may include the selection circuitry 104, the resolution circuitry 106, an arbiter circuitry 308, and a latching circuitry 310. The apparatus 302 may enable an input signal (e.g., input signal D or SI of a first clock domain) that is asynchronous to a clock signal (e.g., signal CLK) of a second clock domain to be synchronized to the clock signal of a second clock domain for generation of a corresponding output signal (e.g., output signal Q) of the second clock domain. The apparatus 302 may utilize some of the same operations and/or configurations as those described for the apparatuses 102 and 202 of FIGS. 1 and 2, respectively.

The apparatus 302 may be distinguished from the apparatus 102 of FIG. 1. For example, the apparatus 302 may include a latching circuitry 310 and may include an arbiter circuitry 308 that at least comprises a dynamic latching differential amplifier. Additionally, the apparatus 302 may have both the arbiter circuitry 308 and the latching circuitry 310 configured to operated based on a clock signal (e.g., CLK) of a second clock domain. Furthermore, the apparatus 302 may enable the mitigation of further meta-stability associated with or arising from timing issues between the components of the apparatus 302. For example, as logic values of the differential signals (e.g., signals qhi, qlo, nqhi, and nqlo) change due to the corresponding selected input signal (e.g., signal D) changing or due to the occurrence of meta-stability unresolved within the resolution circuitry 106, the intermediate output signal (e.g., signal m0) may also correspondingly change. If these changes for the intermediate output signal occur at moments where the clock signal (e.g., CLK) transitions from low to high (e.g., near a rising edge of the clock), further meta-stability may undesirably propagate to the latching circuitry 310. To mitigate this potential further meta-stability, the dynamic latching differential amplifier of the arbiter circuitry 308 may be configured to be enabled and to evaluate the differential signals qhi, qlo, nqhi, and nqlo based on a rising edge of the clock signal (e.g., CLK). Additionally, the latching circuitry 310 may be configured to operate based on the clock signal having reached a logical high value. In this manner, the apparatus 302 may mitigate further signal meta-stability associated with component timing issues during signal synchronization.

The selection circuitry 104 may be configured and may operate substantially similar to the selection circuitry 104 of FIG. 1. For example, the selection circuitry 104 may be configured to select the input signal (e.g., input signal D or input signal SI) based on an enable signal (e.g., signal SE) and a clock signal (e.g., signal CLK) received by the selection circuitry 104 of the apparatus 302. Additionally, the selection circuitry 104 may be further configured to generate a pair of intermediate signals (e.g., signals nqhi and nqlo) associated with the selected input signal and may subsequently drive the generated pair of intermediate signals (e.g., signals nqhi and nqlo) to be received by the resolution circuitry 106.

The resolution circuitry 106 may be configured and may operate substantially similar to the resolution circuitry 106 of FIG. 1. For example, the resolution circuitry 106 may be configured to receive the pair of intermediate signals (e.g., signals nqhi and nqlo) and based on the logic value of the clock signal (e.g., CLK), the resolution circuitry 106 may provide the differential signals (e.g., signals qhi, nqhi, qlo, and nqlo). Additionally, the resolution circuitry 106 may utilize tuned latches to resolve meta-stability associated with the differential signals so as to provide the differential signals with stable states. Further, the resolution circuitry 106 may drive the differential signals to be received by the arbiter circuitry 108 of the apparatus 302.

The arbiter circuitry 308 may be configured to generate an intermediate output signal (e.g., signal m0) based on a determination of a dominant value associated with the differential signals (e.g., signals qhi, nqhi, qlo, and nqlo). The arbiter circuitry 308 may have some of the same operations, couplings, and/or configurations as that of the arbiter circuitry 108 of FIG. 1. For example, the arbiter circuitry 308 may generate an intermediate output signal (e.g., signal m0) based on the differential signals and a determination of a dominant value associated with the differential signals, where the determination may include evaluating different state conditions (e.g., high, low, preferred-high, preferred-low, conflict conditions) associated with the differential signals. Furthermore, the arbiter circuitry 308 may subsequently drive the generated intermediate output signal (e.g., signal m0) to be received by the latching circuitry 310. The arbiter circuitry 308 may be distinguished from the arbiter circuitry 108 of FIG. 1 in various ways. For example, in a particular embodiment, the arbiter circuitry 308 may include a dynamic latching differential amplifier configured to receive the clock signal (e.g., signal CLK) of the second clock domain. Additionally, the latching differential amplifier of the arbiter circuitry 308 may be configured to be enabled and to operate based on a rising clock edge of the clock signal (e.g., signal CLK) received by the arbiter circuitry 308.

The latching circuitry 310 may be configured to generate an output signal (e.g., output signal Q) based on the intermediate output signal (e.g., signal m0) and the clock signal (e.g., signal CLK). The latching circuitry 310 may have some of the same operations, couplings, and/or configurations as that of the latching circuitry 110 of FIG. 1. The latching circuitry 310 may be distinguished from the latching circuitry 110 of FIG. 1 in that the latching circuitry 310 may operate based on the clock signal (e.g., CLK) reaching a logic high value (instead of operation based on a rising clock edge of the clock signal received). The latching circuitry 310 may receive a clock signal (e.g., the signal CLK, of the second clock domain) and based on the clock signal and the voltage value (and corresponding logic value) of the intermediate output signal, the latching circuitry 310 may generate the output signal (e.g., signal Q) that is synchronous with the clock signal of the second clock domain. In a particular embodiment, the latching circuitry 310 may be enabled based on a delayed signal associated with the clock signal (e.g., signal CLK) received by the apparatus 302.

During operation, the apparatus 302 may provide signal synchronization in which an input signal of a first clock domain is transformed to an output signal synchronized to a second clock domain (e.g., a clock domain of the apparatus 302). The apparatus 302 may have some of the same operations as those described for the apparatus 102 of FIG. 1 and may have other operations distinguishable from the apparatus 102 of FIG. 1. For example, in a similar manner as described for the apparatus 102 of FIG. 1, for a particular clock phase, the selection circuitry 104 may select an input signal and provide a pair of intermediate signals (e.g., signals nqhi and nqlo) based on the received input signals, the enable signal, and a logic low value of the clock signal. While the clock signal has the logic low value, the resolution circuitry 106 may capture the pair of intermediate signals, provide differential signals, and resolve any meta-stability associated with the differential signals.

In contrast to the apparatus 102 of FIG. 1, when the clock signal begins to rise (e.g., has a rising clock edge) the arbiter circuitry 308 of the apparatus 302 may determine a dominant value associated with the generated differential signals (e.g., signals qhi, nqhi, qlo, and nqlo) and may generate an intermediate output signal (e.g., signal m0). Furthermore, in contrast to the apparatus 102 of FIG. 1, when the clock signal reaches a logic high value, the latching circuitry 310 may capture the generated intermediate output signal and generate the output signal (e.g., output signal Q) that is synchronous with the clock signal (CLK) of the apparatus 302 (e.g., the second clock domain). The output signal may correspond to the selected input signal and may be driven by the latching circuitry 310.

Such operations of the apparatus 302 may enable mitigation of any further signal meta-stability associated with component timing issues during signal synchronization. Additionally, the reduced stages of the apparatus 302 may enable the capture of a data input signal on a falling edge of the clock signal of the apparatus 302, enable the resolution of any meta-stability within a half clock phase, and provide a synchronized data output signal for use on the next logic high value of the clock signal (e.g., CLK) of the apparatus 302. As a result, the apparatus 302 may provide a reduced latency period for signal synchronization while resolving further meta-stability associated with component timing conflicts or mismatches. Such reduced latency may occur in cases where the clock signal (e.g., CLK) of the apparatus 302 is a high frequency asynchronous clock signal. In these ways, the apparatus 302 may improve signal stability as part of the synchronization of signals to other clock domains (e.g., clock domains with higher frequencies) while reducing synchronization latencies and minimizing performance penalties associated with signal synchronization.

Figure 4:
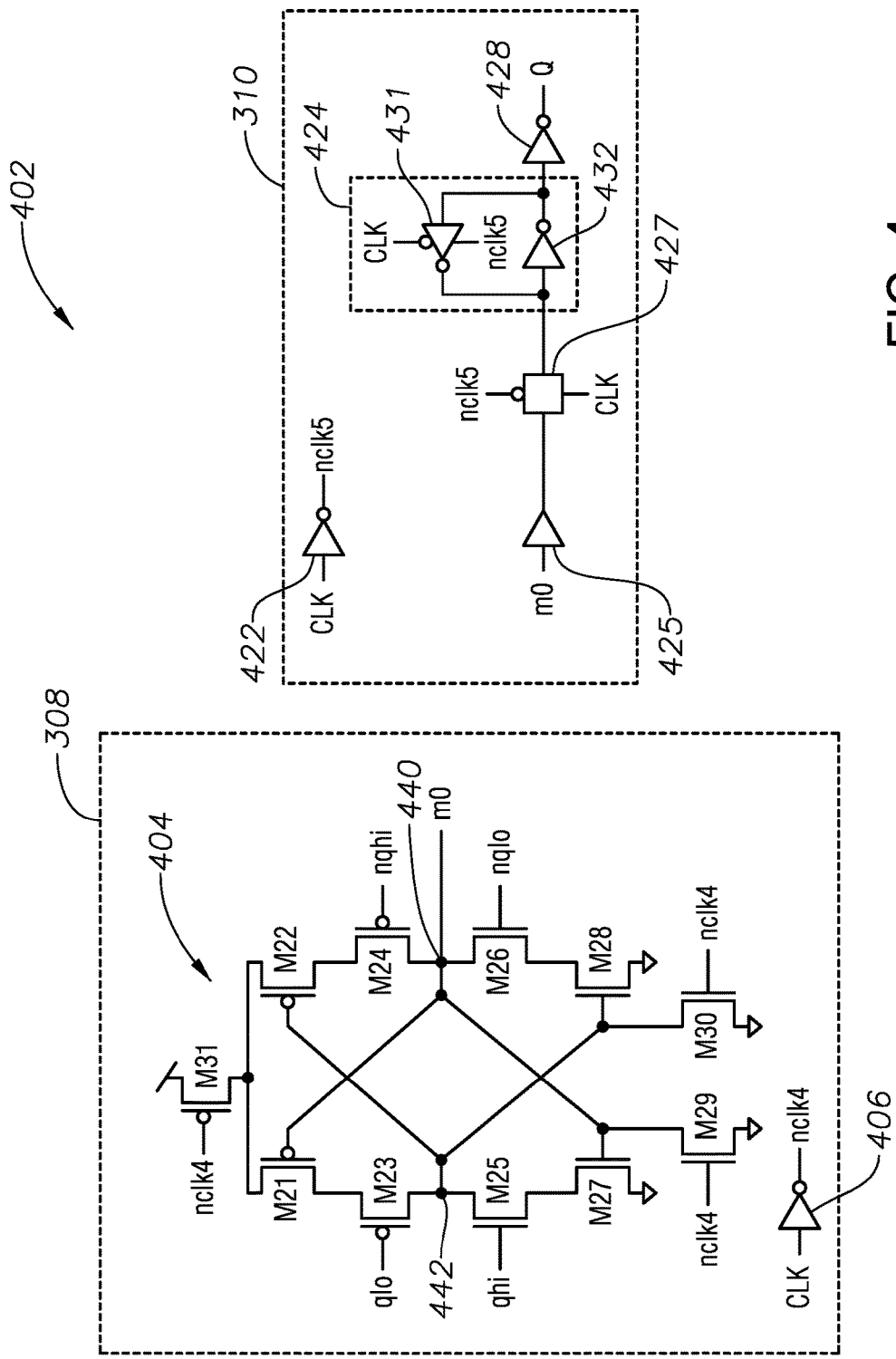
FIG. 4 is a circuit diagram schematically illustrating components of an apparatus for synchronizing an input signal that is asynchronous to a clock signal received by the apparatus in accordance with a particular embodiment described herein.

Referring to FIG. 4, a circuit diagram schematically illustrating an exemplary design of components of an apparatus for synchronizing an input signal that is asynchronous to a clock signal received by the apparatus is shown and generally designated 402. The components 402 may include the arbiter circuitry 308 and the latching circuitry 310 that are exemplary logic and transistor level representations of the arbiter circuitry and the latching circuitry of FIG. 3. The arbiter circuitry 308 and the latching circuitry 310 may be coupled to the selection circuitry 104 and the resolution circuitry 106 of FIG. 3 to form the apparatus 302 of FIG. 3. The selection circuitry 104 and the resolution circuitry 106 may be configured and may operate as described with reference to FIGS. 1-2 while the arbiter circuitry 308 and the latching circuitry 310 may be configured and may operate as described with reference to FIG. 3.

The arbiter circuitry 308 may be comprised of a latching differential amplifier 404 and an inverter 406. The arbiter circuitry 308 includes power supply (e.g., VDD) and a grounding power supply (e.g., VSS) rails (e.g., shown for 404, not shown for 406) of a voltage domain of the apparatus 302. The inverter 406 may receive a clock signal (e.g., signal CLK of a second clock domain) and may generate an inverse clock signal (e.g., signal nclk4). The inverse clock signal (e.g., nclk4) may be received by the latching differential amplifier 404. In a particular embodiment, the inverter 406 may be located outside of the arbiter circuitry 308 to generate the inverse signal (e.g., nclk4). The latching differential amplifier 404 may be comprised of PMOS and NMOS transistors (e.g., transistors M21-M24, M31 and M25-M30, respectively). The latching differential amplifier 404 may be configured to receive the differential signals (e.g., signals qhi, nqhi, qlo, and nqlo) generated by the resolution circuitry 106. The latching differential amplifier 404 of the arbiter circuitry 308 may include a first pair of complementary transistors (e.g., transistors M21 and M27), a second pair of complementary transistors (e.g., transistors M24 and M26), a third pair of complementary transistors (e.g., transistors M22 and M28), and a fourth pair of complementary transistors (e.g., transistors M23 and M25). In a particular embodiment, the first pair and second pair of complementary transistors share a first common node 440, and the third pair and fourth pair of complementary transistors share a second common node 442.

The arbiter circuitry 308 may be configured to determine a dominant value associated with the generated differential signals and based on this determination may generate the intermediate output signal (e.g., signal m0). For example, the latching differential amplifier 404 of the arbiter circuitry 308 may receive the differential signals which may have logic values that correspond to different state conditions as described with regard to FIG. 2 and FIG. 10. The arbiter circuitry 308 may have operations, timing, and/or configurations distinguishable from that of the arbiter circuitry 108 of FIG. 1. For example, the arbiter circuitry 308 may evaluate the different state conditions presented by the logic values of the differential signals based on a rising clock edge of the clock signal (e.g., CLK) as part of determining the dominant value used to generate the intermediate output signal (e.g., signal m0). Evaluation of a particular state condition presented to the arbiter circuitry 308 the by the logic values of the resolution circuitry 106 may be according to the exemplary outcomes of arbiter circuitry as described with reference to FIG. 10. In a particular embodiment, for cases involving the conflict condition, propagation of the differential signals through the latching differential amplifier 404 during the rising clock edge of the clock signal may enable the arbiter circuitry 308 to quickly resolve the conflict condition to generate the intermediate output signal (e.g., signal m0). In a particular embodiment, evaluation by the arbiter circuitry 308 on a rising clock edge of the clock signal may provide a timing constraint for signal synchronization in which the minimum pulse width of the selected input signal may be larger than a low phase of the clock signal (e.g., CLK). In a particular embodiment, the latching differential amplifier 404 may undergo pre-charging when the clock signal (e.g., CLK) has a logical low value. In another embodiment, the pre-charging of the latching differential amplifier 404 may occur when the clock signal (e.g., CLK) has a logical high value. The intermediate output signal (e.g., signal m0) generated by the arbiter circuitry 308 may be synchronized to the clock signal (e.g., CLK signal of the second clock domain) of the apparatus 302. The intermediate output signal (m0) may correspond to the selected input signal (e.g., a selected data signal D) received from the selection circuitry 104.

The latching circuitry 310 may include power supply (e.g., VDD) and grounding power supply (e.g., VSS) rails (not shown) of a voltage domain of the apparatus 302. The latching circuitry 310 may have operations, timing, and/or configurations distinguishable from that of the latching circuitry 110 of FIG. 1. For example, in contrast to the rising clock edge that enables the latching circuitry 110 of FIG. 1, the latching circuitry 310 may receive (via a buffer 425) the intermediate output signal (e.g., signal m0) and may generate the output signal (e.g., signal Q) based on the clock signal (e.g., the signal CLK, of the second clock domain) reaching a logic high value. In one embodiment, the latching circuitry 310 may comprise a transparent high latch. In a particular embodiment the latching circuitry 310 may include an inverter 422, the buffer 425, a transmission gate 427, a latch 424, and an output inverter 428. The inverter 422 may receive a clock signal (e.g., signal CLK of a second clock domain) and generate an inverse clock signal (e.g., signal nclk5). The components (e.g., elements 422, 425, 427, 424, and 428) of the latching circuitry 310 may be configured to operate based on the clock signal (e.g., the signal CLK, of the second clock domain) reaching a logic high value. The output signal (Q) may be driven by the output inverter 428. The generated output signal may have a logic value that corresponds to the logic value of the selected input signal. In a particular embodiment, the inverter 422 may be located outside of the latching circuitry 310 to generate the inverse signal (e.g., nclk4). The latching circuitry 310 may have substantially the same signals, operations, timing, and/or configurations as described for the latching circuitry 310 of FIG. 3.

Figure 5:
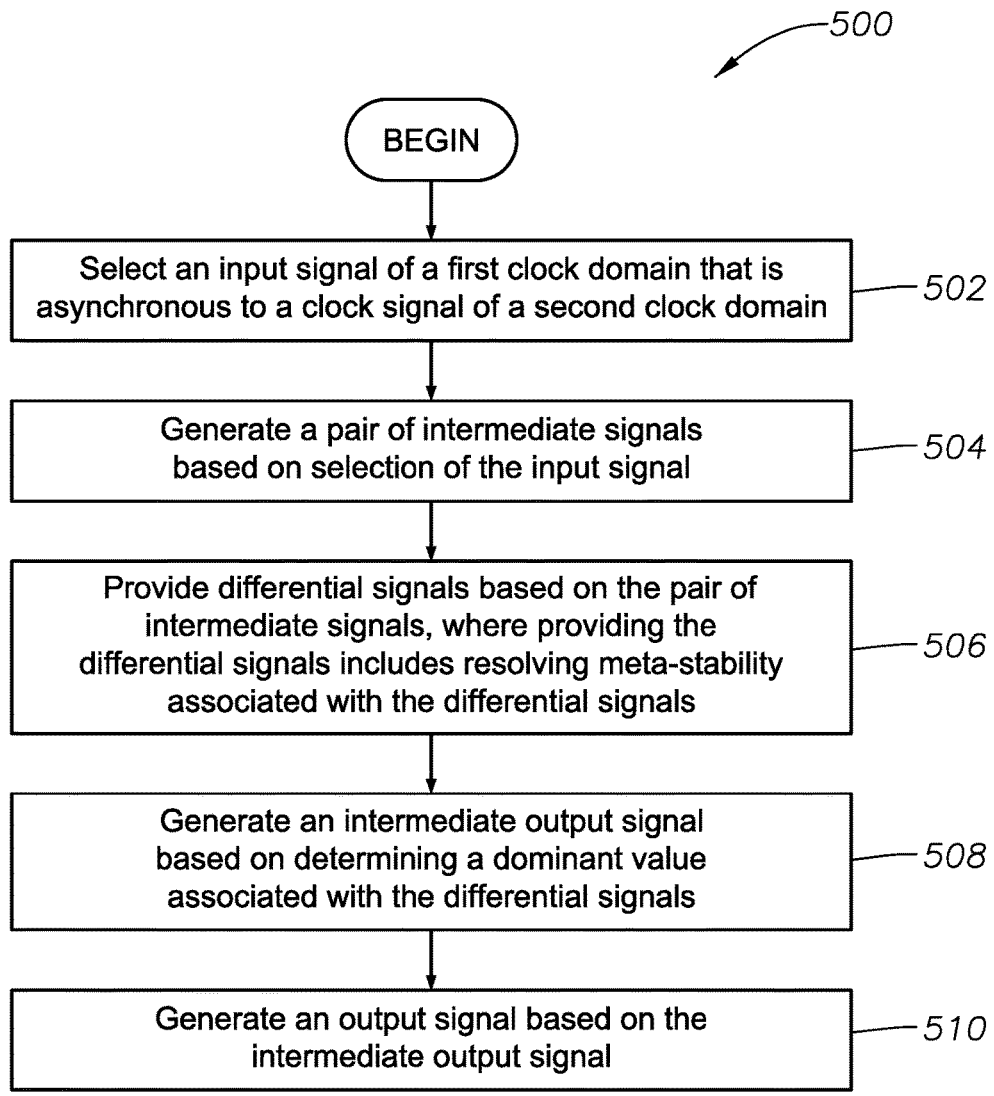
FIG. 5 is a flow chart that illustrates a method for synchronizing an input signal of a first clock domain that is asynchronous to a clock signal of a second clock domain in accordance with embodiments described herein.

Referring to FIG. 5, a flow chart that illustrates a particular embodiment of a method for synchronizing an input signal of a first clock domain that is asynchronous to a clock signal of a second clock domain is shown and generally designated 500. The method 500 includes selecting an input signal of a first clock domain that is asynchronous to a clock signal of a second clock domain at 502. For example, an input signal (e.g., input signal D or input signal SI) and an enable signal (e.g., signal SE) may be received by selection circuitry (e.g., circuitry 104 of FIGS. 1-3) of an apparatus (e.g., the apparatus 102, 202, and 302 of FIGS. 1-3, respectively), as described herein. The enable signal (SE) and the clock signal (e.g., signal CLK) may be provided by control circuitry (not shown) associated with the apparatus. The enable signal and the clock signal may be associated with the activation/deactivation of the selection circuitry in order to enable selection of an input signal such as a scan input signal (SI) or a data input signal (D). For example, while the clock signal has a logic low value and the enable signal SE has a logic high value, the input signal SI is selected. While the clock signal has a logic low value and the enable signal SE has a logic low value, the input signal D is selected. The step 502 may be performed by the selection circuitry 104 of FIGS. 1-3.

The method 500 also includes generating a pair of intermediate signals based on selection of the input signal, at 504. For example, the enable signal (SE) and the clock signal (CLK) may enable selection of an input signal. Upon selection of the input signal, the selection circuitry (e.g., circuitry 104 of FIGS. 1-3) of the apparatus (e.g., the apparatus 102, 202, and 302 of FIGS. 1-3, respectively) may generate the pair of intermediate signals (e.g., signals nqhi and nqlo) associated with the selected input signal as described herein. The selection circuitry may drive the pair of intermediate signals for receipt by the resolution circuitry (e.g., circuitry 106, of FIGS. 1-3). The step 504 may be performed by the selection circuitry 104 of FIGS. 1-3.

The method 500 also includes providing differential signals based on the pair of intermediate signals, where providing the differential signals includes resolving meta-stability associated with the differential signals, at 506. For example, the clock signal (e.g., signal CLK) may be received by the resolution circuitry (e.g., circuitry 106 of FIGS. 1-3) of the apparatus (e.g., the apparatus 102, 202, and 302 of FIGS. 1-3, respectively) as described herein. The clock signal may have reached a logic value (e.g., logic 1, and corresponding voltage value). The resolution circuitry 106 may receive the pair of intermediate signals (e.g., signals nqhi and nqlo) and based on the logic value of the clock signal (e.g., CLK), the resolution circuitry 106 may provide the differential signals (e.g., signals qhi, nqhi, qlo, and nqlo). Furthermore, the resolution circuitry 106 may utilize tuned latches to resolve any meta-stability associated with the differential signals so as to provide the differential signals with stable states. The step 506 may be performed by the resolution circuitry 106 of FIGS. 1-3.

The method 500 also includes generating an intermediate output signal based on determining a dominant value associated with the differential signals, at 508. For example, the arbiter circuitry (e.g., arbiter circuitry 108 of FIGS. 1-2, and arbiter circuitry 308 of FIGS. 3-4) may receive the differential signals provided by the resolution circuitry 106. Based on the logic values of the differential signals and a determination of a dominant value associated with the differential signals, the arbiter circuitry may generate the intermediate output signal (e.g., signal m0). The determination may include evaluating state conditions that include a high condition, a low condition, a preferred-high condition, preferred-low condition, and a conflict condition. The step 508 may be associated with the operations describe for the arbiter circuitry 108 of FIGS. 1-2 and/or the arbiter circuitry 308 of FIGS. 3-4. For example, in a particular embodiment, the step 508 may be associated with or performed by the arbiter circuitry 108 of FIGS. 1-2 having a differential amplifier configured without receipt of a clock signal (e.g., CLK). In another embodiment the step 508 may be associated with or performed by the arbiter circuitry 308 of FIGS. 3-4 having a latching differential amplifier configured to be enabled and to operate based on a rising clock edge of the clock signal received by the arbiter circuitry 308. The arbiter circuitry (e.g., arbiter circuitry 108 of FIGS. 1-2, and arbiter circuitry 308 of FIGS. 3-4) may subsequently drive the generated intermediate output signal (e.g., signal m0) to be received by the latching circuitry (e.g., latching circuitry 110 of FIGS. 1-2, and latching circuitry 310 of FIGS. 3-4).

The method 500 also includes generating an output signal based on the intermediate output signal, at 510. For example, the intermediate output signal (e.g., signal m0) generated by the arbiter circuitry may be received by latching circuitry (e.g., latching circuitry 110 of FIGS. 1-2, and latching circuitry 310 of FIGS. 3-4) of an apparatus (e.g., the apparatus 102, 202, and 302 of FIGS. 1-3, respectively) described herein. The latching circuitry may generate an output signal (e.g., output signal Q) based on the intermediate output signal (e.g., signal m0) and the clock signal (e.g., signal CLK). The latching circuitry may generate the output signal (e.g., signal Q) that is synchronous with the clock signal of the second clock domain. The step 510 may be associated with the operations describe for the latching circuitry 110 of FIGS. 1-2 and/or the latching circuitry 310 of FIGS. 3-4. For example, in a particular embodiment, the step 510 may be associated with or performed by the latching circuitry 110 of FIGS. 1-2 configured to be enabled and to operate based on a rising clock edge of the clock signal (e.g., CLK) received by the latching circuitry 110. In another embodiment the step 510 may be associated with or performed by the latching circuitry 310 of FIGS. 3-4 configured to operate based on the clock signal (e.g., CLK) reaching a logic high value.

It is to be understood that the method 500 may accommodate other operational cases associated with synchronization of an input signal of a first clock domain to an output signal synchronized to a second clock domain (e.g., a clock domain of the apparatus 102, 202, and/or 302). The method 500 may be associated with the potential outcomes described in reference to table T100. The method 500 may be associated with the operations, characteristics, and/or results described for the apparatuses (e.g., 102, 202, and/or 302 of FIGS. 1-3, respectively) and their components (e.g., the block, logic, and transistor level components of FIGS. 1-4). For example, the method 500 may be associated with resolving meta-stability to provide signal state stability during signal synchronization operations. Additionally, the method 500 may be associated with the reduced stages of the apparatuses described herein to provide a reduced latency period for signal synchronization. Furthermore, the method 500 may be associated with enabling reduced latency periods for cases where the clock signal (e.g., CLK) of the apparatuses is a high frequency asynchronous clock signal. In these ways, the method 500 may be used to improve signal stability as part of the synchronization of signals toother clock domains (e.g., clock domains with higher frequencies) while reducing synchronization latencies and minimizing performance penalties associated with signal synchronization.

Figure 6:
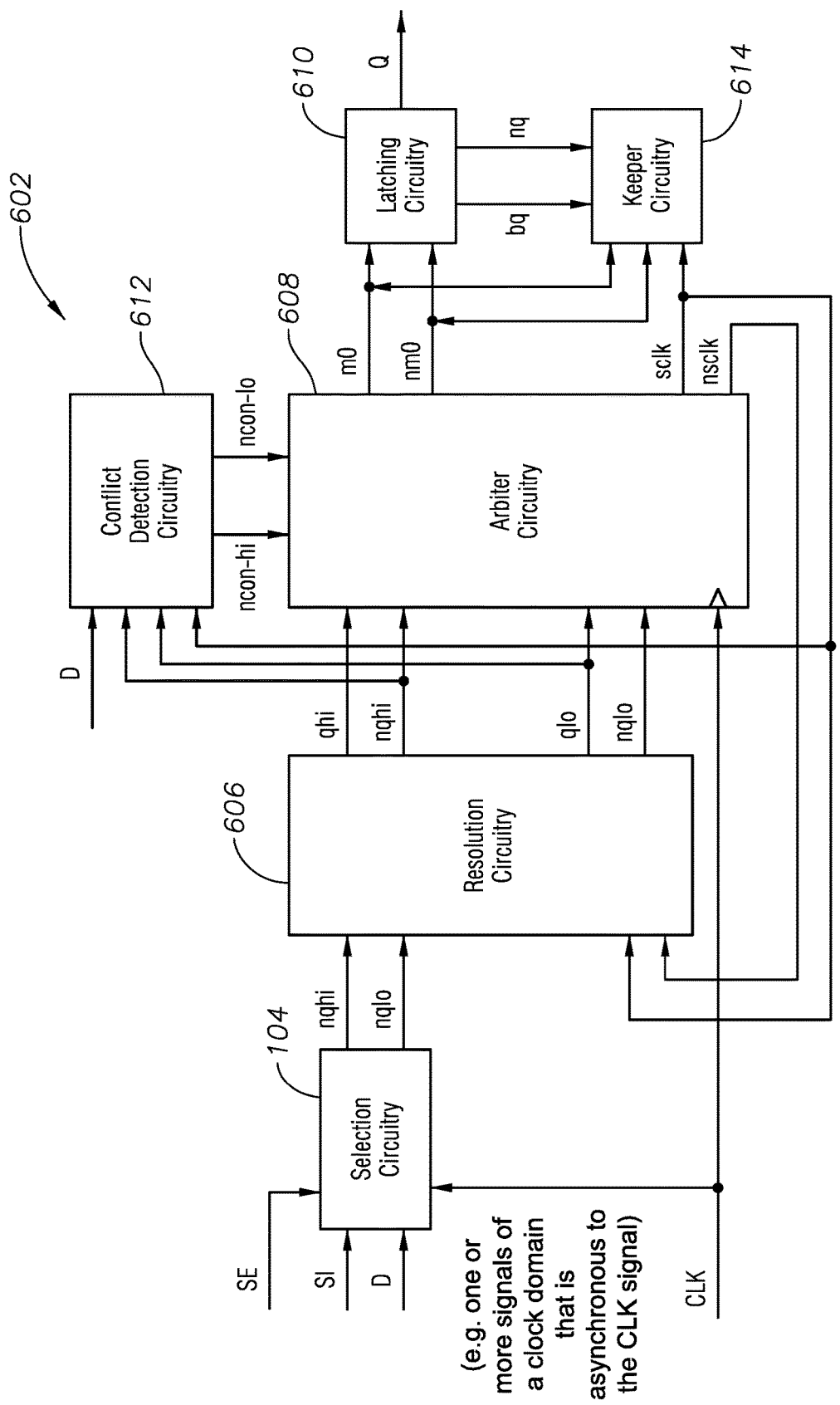
FIG. 6 is a block diagram illustrating an apparatus for synchronizing an input signal that is asynchronous to a clock signal received by the apparatus in accordance with yet another embodiment described herein.

Referring to FIG. 6, a block diagram schematically illustrating an apparatus for synchronizing an input signal that is asynchronous to a clock signal received by the apparatus is shown and generally designated 602. The apparatus 602 may include the selection circuitry 104, a resolution circuitry 606, an arbiter circuitry 608, a latching circuitry 610, a conflict detection circuitry 612, and a keeper circuitry 614. The apparatus 602 may enable an input signal (e.g., input signal D or SI of a first clock domain) that is asynchronous to a clock signal of a second clock domain to be synchronized to the clock signal (e.g., signal CLK) of a second clock domain for generation of a corresponding output signal (e.g., output signal Q) of the second clock domain. The apparatus 602 may utilize some of the same operations and/or configurations as those described for the apparatuses 102, 202, and 202 of FIGS. 1-3, respectively.

The apparatus 602 may be distinguished from the apparatuses 102, 202, and 302 of FIGS. 1-3, respectively. For example, the apparatus 602 may include the resolution circuitry 606 that is enabled based on a completion clock signal (e.g., signal sclk) and its complement signal (e.g., signal nsclk). The apparatus 602 may include the arbiter circuitry 608 that may, among other things, be configured to generate the completion clock signals and to process conflict signals (e.g., signals ncon-hi and ncon-lo). The apparatus 602 may include the conflict detection circuitry 612 that may generate the conflict signals based on the differential signals of the resolution circuitry 606. Additionally, the apparatus 602 may include latching circuitry 610 for output generation and the keeper circuitry 614 that may maintain signal integrity for the intermediate output signals from the arbiter circuitry 608.

Furthermore, the apparatus 602 may enable the mitigation of meta-stability associated with or arising from elements or conditions of the arbiter circuitry 608. For example, mismatching among elements of the arbiter circuitry 608 may cause a narrowing of a width of a timing window associated with operation of the arbiter circuitry 608. If arriving edges of the clock signal (e.g., CLK) and the differential signals (e.g., qhi, qlo, nqhi, and nqlo) drift out (i.e., away from) of the narrowed timing window for the arbiter circuitry 608, operations of the arbiter circuitry 608 may become meta-stable. Meta-stability associated with the differential signals themselves may also contribute to the potential meta-stability of the arbiter circuitry 608.

To mitigate this potential meta-stability associated with the arbiter circuitry 608, the apparatus 602 may utilize the conflict detection circuitry 612 and the arbiter circuitry 608 configured to process conflict signals to enable a biasing of the arbiter circuitry 608 for the generation of intermediate output signals (e.g., signal m0 and its inverse signal nm0) in a pre-determined way. Furthermore, the apparatus 602 may be configured to enable timing of the resolution circuitry 606 and operations of the latching circuitry 610 to be based upon completion signals that may indicate the completion of the arbiter circuitry 608 determination/generation operations. In this manner, the apparatus 602 may mitigate any potential meta-stability associated with or arising from elements or conditions of the arbiter circuitry 608. Such meta-stability mitigation may further improve signal stability associated with synchronization of signals to other clock domains (e.g., clock domains with higher frequencies) while reducing synchronization latencies and minimizing performance penalties associated with signal synchronization.

The selection circuitry 104 may utilize some of the same operations and/or configurations as those described for the selection circuitry 104 of FIGS. 1-3. For example, the selection circuitry 104 may be coupled to a resolution circuitry (e.g., the resolution circuitry 606). Additionally, the selection circuitry 104 may be configured to select the input signal (e.g., input signal D or input signal SI) based on an enable signal (e.g., signal SE) and a clock signal (e.g., signal CLK) received by the selection circuitry 104 of the apparatus 302. Furthermore, the selection circuitry 104 may be further configured to generate a pair of intermediate signals (e.g., signals nqhi and nqlo) associated with the selected input signal and may subsequently drive the generated pair of intermediate signals to be received by the resolution circuitry 606.

The resolution circuitry 606 may utilize some of the same operations and/or configurations as those described for the resolution circuitry 106 of FIGS. 1-3. For example, the resolution circuitry 606 may be coupled to an arbiter circuitry (e.g., the arbiter circuitry 608) and may receive the pair of intermediate signals (e.g., signals nqhi and nqlo) in order to provide the differential signals (e.g., signals qhi, nqhi, qlo, and nqlo). Additionally, the resolution circuitry 606 may utilize tuned latches to resolve meta-stability associated with the differential signals so as to provide the differential signals with stable states. Further, the resolution circuitry 606 may subsequently drive the differential signals to be received by the arbiter circuitry.

The resolution circuitry 606 may have operations, timing, and/or configurations distinguishable from that of the resolution circuitry 106 of FIGS. 1-3. For example, in contrast to the clock signal (e.g., CLK) that enables the resolution circuitry 106 of FIGS. 1-3, the resolution circuitry 606 may be enabled based on a completion clock signal (e.g., completion clock signal sclk) and its inverse signal (e.g., inverse completion clock signal nsclk). Accordingly, the resolution circuitry 606 may be configured to receive the pair of intermediate signals (e.g., signals nqh and nql) and based on the logic values of the completion clock signals (e.g., sclk and nsclk), the resolution circuitry 606 may provide the differential signals (e.g., signals qhi, nqhi, qlo, and nqlo).

The arbiter circuitry 608 may utilize some of the same operations and/or configurations as those described for the arbiter circuitry 308 of FIGS. 3-4. For example, the arbiter circuitry 608 may be coupled to resolution circuitry (e.g., resolution circuitry 606) and to latching circuitry (e.g., latching circuitry 610) and may be enabled based on a rising clock edge of the clock signal received by the arbiter circuitry 608. Additionally, the arbiter circuitry 608 may generate an intermediate output signal (e.g., signal m0) based on the differential signals and a determination of a dominant value associated with the differential signals, where the determination may include evaluating different state conditions (e.g., high, low, preferred-high, and preferred-low conditions) associated with the differential signals. Furthermore, the arbiter circuitry 608 may subsequently drive the generated intermediate output signal (e.g., signal m0) to be received by the latching circuitry (e.g., latching circuitry 610).

The arbiter circuitry 608 may be distinguished from the arbiter circuitry 308 of FIGS. 3-4 in various ways. For example, in a particular embodiment, the arbiter circuitry 608 may include a conflict differential amplifier configured to receive the conflict signals (e.g., signals ncon-hi and ncon-lo) from the conflict detection circuitry 612. Additionally, the arbiter circuitry 608 may include completion clock circuitry configured to generate a completion clock signal (e.g., completion clock signal sclk) and its inverse signal (e.g., inverse completion clock signal nsclk) based on the intermediate output signals and the rising clock edge of the clock signal (e.g., signal CLK). Furthermore, the arbiter circuitry 608 may generate the inverse intermediate output signal (e.g., signal nm0) that may be subsequently driven to be received by the latching circuitry (e.g., latching circuitry 610). In these ways, the arbiter circuitry 608 may configured to be biased by the conflict signals to enable the arbiter circuitry 608 to process the differential signals for generation of intermediate output signals (e.g., signal m0 and signal nm0).

The latching circuitry 610 may be distinguished from the latching circuitry 110 of FIGS. 1-2 and the latching circuitry 310 of FIGS. 3-4 in various ways. For example, the latching circuitry 610 may be configured to generate an output signal (e.g., output signal Q) based on the intermediate output signals (e.g., signal m0 and signal nm0). In a particular embodiment, the generated output signal (e.g., output signal Q) may be further based on the value of one of the intermediate signals being maintained by operations of the keeper circuitry 614. Additionally, the latching circuitry 610 may be comprised of a set-reset latch configured to generate feedback signals (e.g., signals bq and nq) based on the intermediate output signals (e.g., signal m0 and signal nm0). Furthermore, the latching circuitry 610 may provide the feedback signals to the keeper circuitry 614. In these ways, the latching circuitry 610 may generate the output signal (e.g., signal Q) that is synchronous with the clock signal (e.g., CLK) of the second clock domain.

The conflict detection circuitry 612 may be coupled to the resolution circuitry 606 and to arbiter circuitry 608. The conflict detection circuitry 612 may be configured to generate conflict signals (e.g., signals ncon-hi and ncon-lo) based on a conflict state condition detected by the conflict detection circuitry 612. For example, the conflict detection circuitry 612 may receive the differential signals nqhi and qlo, the completion clock signal sclk, and the input signal D. The conflict detection circuitry 612 may detect a conflict condition associated with the differential signals nqhi and qlo and may generate the conflict signals based on the conflict condition, the completion clock signal sclk, and the input signal D. The conflict detection circuitry 612 may provide the conflict signals (ncon-hi and ncon-lo) to the arbiter circuitry 608 for biasing the arbiter circuitry 608. In a particular embodiment, the conflict detection circuitry 612 may detect an additional condition in which the differential signal qhi has a logical low value and the differential signal qlo has a logical high value. For example, such a condition may occur upon circuit initialization (e.g., upon powering-up of circuitry) and the conflict detection circuitry 612 may detect this condition and force resolution by the arbiter circuitry 608.

The keeper circuitry 614 may be coupled to the arbiter circuitry 608 and to latching circuitry 610. The keeper circuitry 614 may be configured to maintain an intermediate output signal (e.g., either signal m0 or nm0) at a logic low value after generation of the intermediate output signal by the arbiter circuitry. For example, the keeper circuitry 614 may receive the feedback signals (e.g., bq and nq) generated by the latching circuitry 610 and may receive the intermediate signals (e.g., m0 and nm0) and the completion clock signal (e.g., sclk) generated by the arbiter circuitry 608. In the case where the intermediate signal m0 has a logic low level (e.g., logic 0) value and then subsequently has its value drift away from logic low to a logic high, the keeper circuitry 614 may be configured to maintain the value of the intermediate signal m0 at its intended output value of the logic low level (e.g., logic 0). In this way, the keeper circuitry 614 may be configured to have bi-directional connections with the arbiter circuitry 608 in order to maintain a logic value for an intermediate output signal (e.g., either signal m0 or nm0) after generation of the intermediate output signal by the arbiter circuitry 608.

During operation, the apparatus 602 may provide signal synchronization in which an input signal of a first clock domain is transformed to an output signal synchronized to a second clock domain (e.g., a clock domain of the apparatus 602). The apparatus 602 may have some of the same operations as those described for the apparatuses 102, 202, and 302 of FIGS. 1-3, respectively. For example, for a particular clock phase, the selection circuitry 104 may select an input signal and generate a pair of intermediate signals (e.g., signals nqhi and nqlo) based on the received input signals, the enable signal, and a logic low value of the clock signal.

The apparatus 602 may have other operations distinguishable from apparatuses 102, 202, and 302 of FIGS. 1-3, respectively. For example, during operation, when the completion clock signal sclk has the logic low value (the nsclk has the logic high value), the resolution circuitry 606 may capture and hold the pair of intermediate signals, may provide differential signals, and may resolve any meta-stability associated with the differential signals. While the completion clock signal sclk has the logic low value, the conflict detection circuitry 612 may determine the presence of a conflict condition associated with the differential signals nqhi and qlo. If the conflict condition is detected, the conflict detection circuitry 612 may generate conflict signals ncon-hi and ncon-lo that may be used to bias the arbiter circuitry 608. For example, if the conflict condition is detected, in a particular embodiment, the arbiter circuitry 608 may be biased to generate intermediate output signals with logic values corresponding to the current logic value of the selected input signal. To illustrate, for a conflict condition, if the selected D signal has a logic high value, the intermediate output signal m0 may be generated to have a logic high value.

In cases where no conflict condition is detected, as the clock signal (e.g., CLK) rises (i.e., has a rising clock edge), the arbiter circuitry 608 may determine a dominant value based on the different state conditions (e.g., high, low, preferred-high, and preferred-low conditions) associated with the differential signals (e.g., signals qhi, nqhi, qlo, and nqlo) and may generate the intermediate output signals (e.g., signals m0 and nm0) based on the determination. In the case of a conflict condition, the arbiter circuitry 608 may be biased by the values of the conflict signals (e.g., ncon-hi and ncon-lo) to generate the intermediate output signals with predetermined logic values. When the arbiter circuitry 608 has generate the intermediate output signals, completion clock circuitry associated with the arbiter circuitry 608 may generate the completion clock signals (e.g., sclk and nsclk) such that the completion clock signal sclk may have a rising logical value (e.g., a rising clock edge).

While the clock signal (e.g., CLK) rises, the generated intermediate output signals may be received by the latching circuitry 610 to set or reset the latching circuitry 610 for generation of the output signal Q. For the case when the intended value of the intermediate output signal (e.g., m0) is a logic low value and the generated completion clock signal sclk has a logic high value, the keeper circuitry 614 may provide the intermediate output signal (e.g., either signal m0 or nm0) value to be maintained at a logic low value after generation of the intermediate output signal by the arbiter circuitry 608. In this manner the keeper circuitry 614 may prevent the drifting of the intermediate output signal's value away from its intended logic value.

In these ways, the apparatus 602 may utilize the conflict detection circuitry 612, the arbiter circuitry 608, and the completion clock signals of the arbiter circuitry 608 to enable the processing of potential state conditions (e.g., high, low, and conflict conditions) while reducing potential meta-stability for the generation of the intermediate output signals (e.g., signals m0 and nm0) with reduce latency. Accordingly, the apparatus 602 may provide mitigation of any potential meta-stability associated with or arising from elements or conditions of the arbiter circuitry 608. Such meta-stability mitigation may further improve signal stability associated with synchronization of signals to other clock domains (e.g., clock domains with higher frequencies) while reducing synchronization latencies and minimizing performance penalties associated with signal synchronization.

Figure 7:
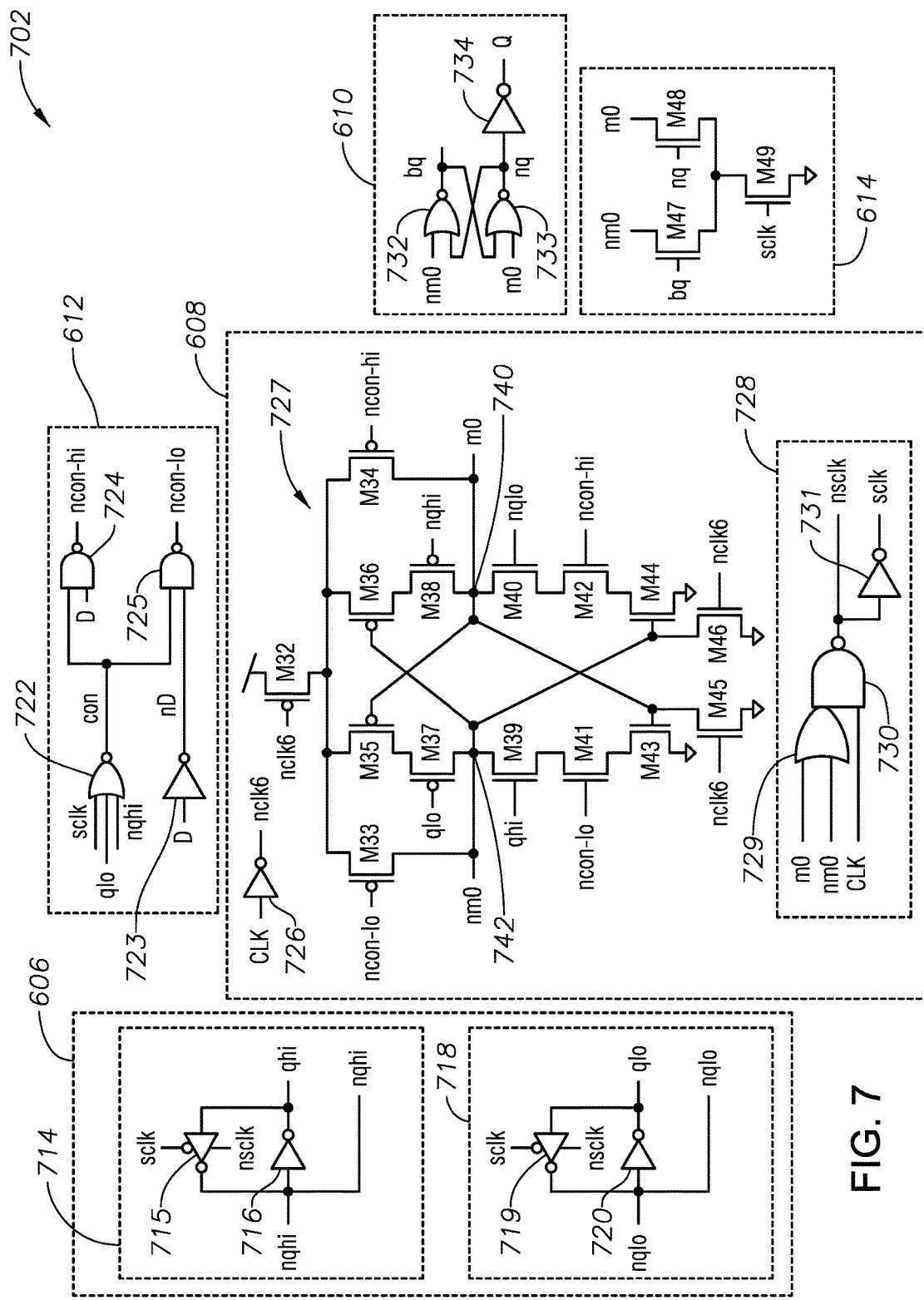
FIG. 7 is a circuit diagram schematically illustrating components of an apparatus for synchronizing an input signal that is asynchronous to a clock signal received by the apparatus in accordance with yet another embodiment described herein.

Referring to FIG. 7, a circuit diagram schematically illustrating an exemplary design of components of an apparatus for synchronizing an input signal that is asynchronous to a clock signal received by the apparatus is shown and generally designated 702. The components 702 may be exemplary logic and transistor level representations of the resolution circuitry 606, the arbiter circuitry 608, the latching circuitry 610, the conflict detection circuitry 612, and the keeper circuitry 614 of the apparatus 602 of FIG. 6. The components 702 (e.g., circuitries 606-614) may have substantially the same signals, operations, timing, and/or configurations as described for the resolution circuitry 606, the arbiter circuitry 608, the latching circuitry 610, the conflict detection circuitry 612, and the keeper circuitry 614 of the apparatus 602 of FIG. 6.

The resolution circuitry 606 may be coupled to the arbiter circuitry 608 and the conflict detection circuitry 612. The resolution circuitry 606 may be configured to provide differential signals based on the pair of intermediate signals and the completion clock signals (e.g., signals sclk and nsclk). The resolution circuitry 606 may include a first latch (e.g., a high-tuned latch) 714, and a second latch (e.g., a low-tuned latch) 718. The resolution circuitry 606 includes power supply (e.g., VDD) and a grounding power supply (e.g., VSS) rails (not shown) of a voltage domain of an apparatus (e.g., the apparatus 602 of FIG. 6). The completion clock signals (e.g., signals sclk and nsclk) may be received by the high-tuned latch 714, and the low-tuned latch 718. In a one embodiment, the first latch 714 may be preferably tuned to generate a logical high value associated with the differential signals and the second latch 718 may be preferably tuned to generate a logical low value associated with the differential signals.

To illustrate, the high-tuned latch 714 (e.g., the first latch) may include a first tri-state inverter 715 and a first inverter 716. The first tri-state inverter 715 and the first inverter 716 may be configured such that the input of each is coupled to the output of the other so that they form a pair of cross-coupled inverters. The cross-coupled pair (first tri-state inverter 715 and first inverter 716) may receive the intermediate signal nqhi and may provide the differential signal qhi. The high-tuned latch 714 may resolve any meta-stability associated with the differential signal qhi so as to provide the differential signal qhi with a stable state. The high-tuned latch 714 may include PMOS and NMOS transistors that are preferentially tuned to favor resolving to a logical high value. The preferential tuning may be based on different sizing of one or more PMOS and one or more NMOS transistors. For example, the first inverter 716 may include a PMOS transistor that is sized larger than a PMOS transistor of the first tri-state inverter 715. The first inverter 716 may also include an NMOS transistor that is sized smaller than an NMOS transistor of the first tri-state inverter 715. In this manner, the high-tuned latch 714 can provide the differential signal qhi and resolve any meta-stability associated with the differential signal qhi.

The low-tuned latch 718 (e.g., the second latch) may include a second tri-state inverter 719 and a second inverter 720. The second tri-state inverter 719 and the second inverter 720 may be configured such that the input of each is coupled to the output of the other so that they form another pair of cross-coupled inverters. The cross-coupled pair (second tri-state inverter 719 and second inverter 720) may receive the intermediate signal nqlo and may provide the differential signal qlo. The low-tuned latch 718 may resolve any meta-stability associated with the differential signal qlo so as to provide the differential signal qlo with a stable state. The low-tuned latch 718 may include PMOS and NMOS transistors that are preferentially tuned to favor resolving to a logical low value. The preferential tuning may be based on different sizing of one or more PMOS and one or more NMOS transistors. For example, the second inverter 720 may include a PMOS transistor that is sized smaller than a PMOS transistor of the second tri-state inverter 719. The second inverter 720 may also include an NMOS transistor that is sized larger than an NMOS transistor of the second tri-state inverter 719. In this manner, the low-tuned latch 718 can provide the differential signal qlo and resolve any meta-stability associated with the differential signal qlo.

In a particular embodiment, the first latch (e.g., the high-tuned latch 714) and the second latch (e.g., the low-tuned latch 718) are enabled based on the completion clock signal sclk having the logic low value (which corresponds to a logic low value for the CLK signal). In another embodiment, the first latch 714 and the second latch 718 are enabled based on a falling clock edge of the completion clock signal sclk (corresponding to a falling clock edge of the CLK signal). In this manner, the first and second latches may capture and hold the pair of intermediate signals, provide the differential signals, and may resolve any meta-stability associated with the differential signals.

The arbiter circuitry 608 may be comprised of an inverter 726, a conflict differential amplifier 727, and a completion clock circuitry 728. The arbiter circuitry 608 may include power supply (e.g., VDD) and a grounding power supply (e.g., VSS) rails (e.g., shown for 727, not shown for 726 or 728) of a voltage domain of an apparatus (e.g., the apparatus 602 of FIG. 6). The inverter 726 may receive a clock signal (e.g., signal CLK of a second clock domain) and may generate an inverse clock signal (e.g., signal nclk6). The inverse clock signal (e.g., nclk6) may be received by the conflict differential amplifier 727. In a particular embodiment, the inverter 726 may be located outside of the arbiter circuitry 608 to generate the inverse signal (e.g., nclk6).

The conflict differential amplifier 727 of the arbiter circuitry 608 may be comprised of PMOS and NMOS transistors (e.g., transistors M32-M38 and M39-M46, respectively). An exemplary configuration of the conflict differential amplifier 727 is depicted in FIG. 7. The conflict differential amplifier 727 may be configured to receive the differential signals provided by the resolution circuitry 606 and to receive the conflict signals generated by the conflict detection circuitry 612. The conflict differential amplifier 727 of the arbiter circuitry 608 may include a first pair of complementary transistors (e.g., transistors M35 and M43), a second pair of complementary transistors (e.g., transistors M38 and M40), a third pair of complementary transistors (e.g., transistors M36 and M44), and a fourth pair of complementary transistors (e.g., transistors M37 and M39). In a particular embodiment, the first pair and second pair of complementary transistors share a first common node 740, and the third pair and fourth pair of complementary transistors share a second common node 742. In another embodiment, the conflict differential amplifier 727 may be a latching differential amplifier (e.g., similar to the amplifier 404 of FIG. 4) configured with conflict signal circuitry (e.g., transistors M33, M41, M34, and M42) to enable receipt of conflict signals (ncon-hi and ncon-lo) for conflict signal biasing. In a particular embodiment, the conflict differential amplifier 727 may undergo pre-charging when the clock signal (e.g., CLK) has a logical low value. In another embodiment, the pre-charging of the conflict differential amplifier 727 may occur when the clock signal (e.g., CLK) has a logical high value.

The arbiter circuitry 608 may be configured to determine a dominant value associated with the differential signals and based on this determination may generate the intermediate output signals (e.g., signals m0 and nm0). The determination may be based on different state conditions associated with the differential signals and on conflict signals from the conflict detection circuitry 612. For example, the resolution circuitry 606 may resolve meta-stability as part of providing the differential signals qhi, qlo, nqhi, and nqlo. The logic values of the differential signals may be associated with different state conditions that include a high condition, a low condition, a preferred-high condition, a preferred-low condition, and a conflict condition. The conflict detection circuitry 612 may detect the occurrence of the conflict condition and may generate conflict signals to be processed by the conflict differential amplifier 727 of the arbiter circuitry 608.

The arbiter circuitry 608 may evaluate and process the different state conditions presented by the logic values of the differential signals along with any generated conflict signals (e.g., ncon-hi and ncon-lo) as part of determining the dominant value for generating the intermediate output signals (e.g., signals m0 and nm0). The determined dominant value may be a logic low value or a logic high value. Evaluation by the arbiter circuitry 608 of a particular state condition presented by the logic values of the resolution circuitry 606 may be according to the exemplary outcomes as described with reference to FIG. 10. Evaluation by the arbiter circuitry 608 may also include the processing of a conflict signals that indicate the occurrence of the conflict condition and a predetermine biasing for the conflict differential amplifier 727. In a particular embodiment, the values of the conflict signals may force the arbiter circuitry 608 to resolve to a predetermined state value (e.g., high or low state value). In another embodiment, the values of the conflict signals may force the arbiter circuitry 608 to resolve to a current value of the selected input signal. The intermediate output signals (e.g., m0 and nm0) generated by the arbiter circuitry 608 may be synchronized to the clock signal (e.g., CLK signal of the second clock domain) of the apparatus (e.g., the apparatus 602). The intermediate output signals (e.g., m0 and nm0) may correspond to the selected input signal (e.g., a selected data signal D).

The completion clock circuitry 728 of the arbiter circuitry 608 may be comprised of combinational logic gate elements that include an OR gate 729, a NAND gate 730, and an inverter 731. The completion clock circuitry 728 may be configured to receive the intermediate output signals (e.g., m0 and nm0) and the clock signal (e.g., signal CLK of a second clock domain) so as to generate the completion clock signals (e.g., signals sclk and nsclk). The completion clock signals (e.g., signals sclk and nsclk) may be received by the resolution circuitry 606 and the completion clock signal sclk may be received by the keeper circuitry 614. In a particular embodiment, the completion clock circuitry 728 may be located outside of the arbiter circuitry 608 to generate the completion clock signals (e.g., signals sclk and nsclk). The completion clock circuitry 728 includes power supply (e.g., VDD) and a grounding power supply (e.g., VSS) rails (not shown) of a voltage domain of an apparatus (e.g., the apparatus 602 of FIG. 6).

The conflict detection circuitry 612 may be comprised of combination logic gate elements that include a NOR gate 722, an inverter 723, a NAND gate 724, and another NAND gate 725. The conflict detection circuitry 612 includes power supply (e.g., VDD) and a grounding power supply (e.g., VSS) rails (not shown) of a voltage domain of an apparatus (e.g., the apparatus 602 of FIG. 6). The conflict detection circuitry 612 may be configured to receive the differential signals (e.g., qlo and nqhi), the data input signal (e.g., signal D), and the completion clock signal (e.g., sclk) so as to generate the conflict signals (e.g., signals ncon-hi and ncon-lo). The conflict signals may be received by the conflict differential amplifier 727 of the arbiter circuitry 608. The conflict detection circuitry 612 may generate conflict signals to bias the conflict differential amplifier 727. Such biasing may force the arbiter circuitry 608 to resolve to a predetermined state value as part of determining the dominant value for generating the intermediate output signals (e.g., signals m0 and nm0). For example, the conflict detection circuitry 612 may generate a conflict signal (e.g., ncon-hi) indicating that a conflict has been detected and the arbiter circuitry 608 should be driven to a high predetermined state. Additionally, the conflict detection circuitry 612 may generate a conflict signal (e.g., ncon-lo) indicating that a conflict has been detected and the arbiter circuitry 608 should be driven to a low predetermined state.

In a particular embodiment, conflict signal biasing of the conflict differential amplifier 727 may force the arbiter circuitry 608 to resolve to a current value of the selected input signal. To illustrate, for a particular clock cycle, the input signal D may be sampled on the falling edge of sclk (corresponding to a falling edge of the CLK signal). Conflict detection by the conflict detection circuitry 612 may occur after the falling edge of sclk but prior to a rising edge of the clock signal (e.g., CLK). The occurrence and detection of a conflict condition may be the result of the input signal D being sampled during a transition period where its logic value resulted in the two latches of the resolution circuitry 606 resolving different values (e.g., a conflict condition). A half clock cycle after the falling edge of sclk (falling edge of the CLK signal) the CLK signal rises and the arbiter circuitry 608 evaluates the differential signals as part of determining the dominant value for generating the intermediate output signals (e.g., signals m0 and nm0). At this time, the input signal D is expected to have arrived at its next logic value. In this way the input signal D can be used by the conflict detection circuitry 612 to force the arbiter circuitry 608 to resolve to a current value of the selected input signal D.

The latching circuitry 610 may be comprised of a particular set-reset latch. For example, the latching circuitry 610 may be comprised of combination logic gate elements that include a NOR gate 732, another NOR gate 733, and an inverter 734. The latching circuitry 610 includes power supply (e.g., VDD) and a grounding power supply (e.g., VSS) rails (not shown) of a voltage domain of an apparatus (e.g., the apparatus 602 of FIG. 6). The latching circuitry 610 may be configured to receive the intermediate output signals (e.g., m0 and nm0) so as to generate feedback signals (e.g., signals bq and nq) and the output signal (e.g., signal Q) that is synchronous with the clock signal of the second clock domain (e.g., the signal CLK, of the second clock domain). The feedback signals (e.g., signals bq and nq) may be provided to the keeper circuitry 614 for use in maintaining an intermediate output signal (e.g., either signal m0 or nm0) at a logic low value after intermediate output signal generation. The output signal (Q) may be driven by the inverter 734. The generated output signal (Q) may have a logic value that corresponds to the logic value of the selected input signal.

The keeper circuitry 614 may be comprised of NMOS transistors (e.g., transistors M47-M49). An exemplary configuration of the keeper circuitry 614 is depicted in FIG. 7. The keeper circuitry 614 may include a grounding power supply (e.g., VSS) rail (shown) of a voltage domain of an apparatus (e.g., the apparatus 602 of FIG. 6). The keeper circuitry 614 may be configured to receive the feedback signals (e.g., signals bq and nq) and the completion clock signal (e.g., signal sclk) to enable the maintenance of a logic low value at an intermediate output signal (e.g., either signal m0 or nm0) after generation of the intermediate output signal by the arbiter circuitry 608. For example, in cases where logic values of the selected input change during a particular clock phase (e.g., such as when the clock signal CLK has a logic high value), the intermediate output signals (e.g., m0 and nm0) of the arbiter may become undriven (e.g., tri-stated). This can occur if one of the intermediate output signals (e.g., m0) has a logic value that begins to drift away from its intended logic value (the logic value generated by the arbiter circuitry 608). To illustrate, if the generated intermediate output signal (e.g., m0) has an intended logic high value, the drifting of its logic high value to a logic low value will not disturb the logic value of the output signal (Q). This lack of disturbance may result from the latching circuitry 610 holding (e.g., latching) the intended values when, due to drifting, the m0 and nm0 inputs to the latching circuitry 610 both have a logic low value (e.g. in accordance with logic operations of an SR latch). However, if the generated intermediate output signal (e.g., m0) has a logic low value, the drifting of its logic low value to a logic high value may upset the latching circuitry 610 and disturb the logic value of the output signal (Q). The use of the keeper circuitry 614 to maintain a logic low value at an intermediate output signal after its generation may mitigate any disturbance of output signal (Q) due to the potential drifting of the logic value of an intermediate output signal (e.g., m0).

The components 702 as part of the apparatus 602 of FIG. 6 may enable a selected input signal (e.g., input signal D of a first clock domain) that is asynchronous to a clock signal (e.g., CLK) of a second clock domain to be synchronized to the clock signal of a second clock domain for the generation of a corresponding output signal (e.g., output signal Q) synchronized to the second clock domain. The components 702 as part of the apparatus 602 of FIG. 6 may provide similar attributes/enhancements (meta-stability resolutions, reduced FF stages, reduced latency periods, etc.) as those described for the apparatus 602 of FIG. 6. In these ways, the components 702 as part of the apparatus 602 of FIG. 6 may provide reduced latency periods for signal synchronization while utilizing a reduced number of circuit stages to enable improved signal stability as part of the signal synchronization in a manner substantially the same as that described for the apparatus 602 of FIG. 6.

Figure 8:
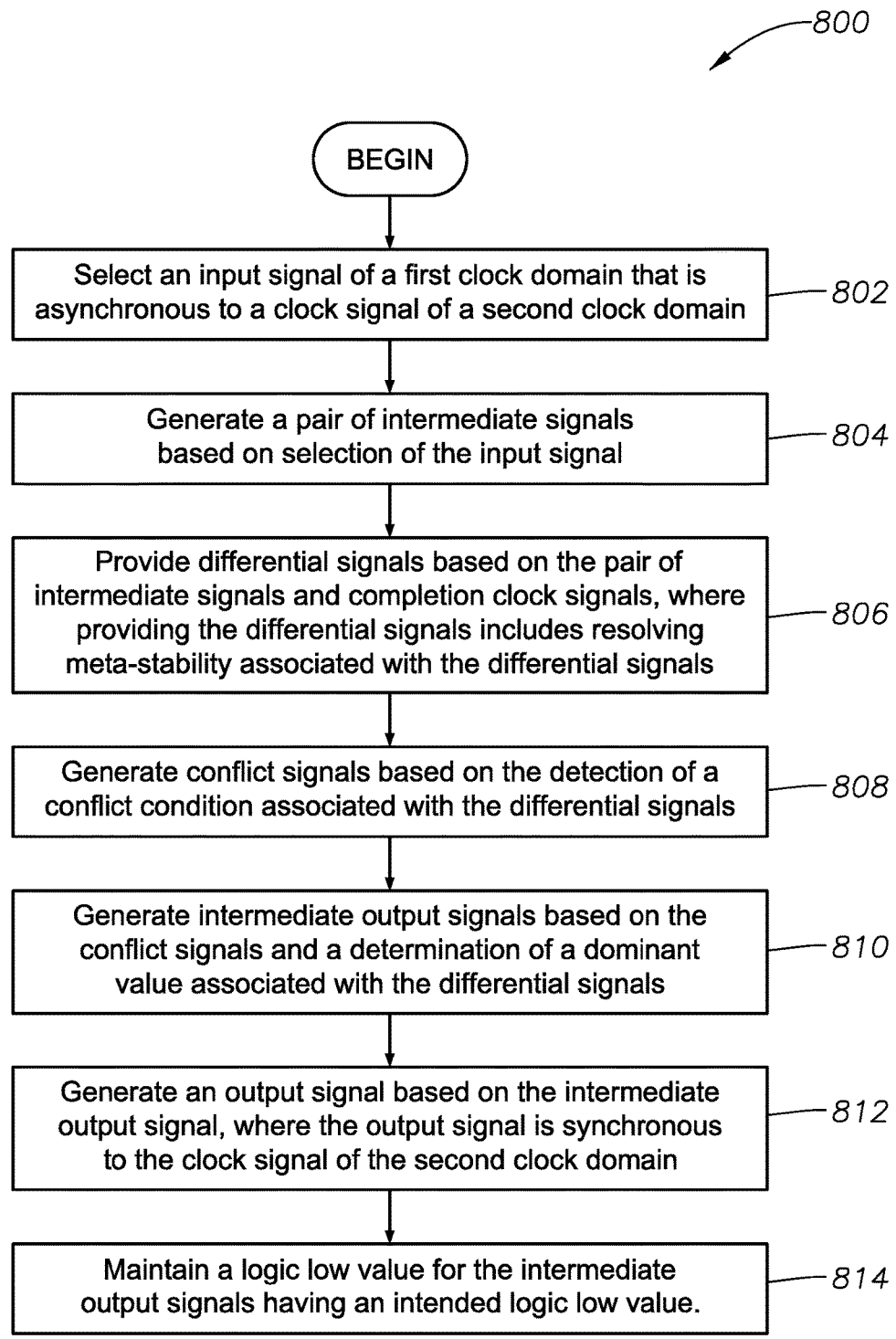
FIG. 8 is another flow chart that illustrates a method for synchronizing an input signal of a first clock domain that is asynchronous to a clock signal of a second clock domain in accordance with further embodiments described herein.

Referring to FIG. 8, a flow chart that illustrates a particular embodiment of a method for synchronizing an input signal of a first clock domain that is asynchronous to a clock signal of a second clock domain is shown and generally designated 800. The method 800 includes selecting an input signal of a first clock domain that is asynchronous to a clock signal of a second clock domain at 802. For example, an input signal (e.g., input signal D or input signal SI) and an enable signal (e.g., signal SE) may be received by selection circuitry (e.g., circuitry 104 of FIG. 6) of an apparatus (e.g., the apparatus 602 of FIG. 6), as described herein. The enable signal (SE) and the clock signal (e.g., signal CLK) may be provided by control circuitry (not shown) associated with the apparatus. The enable signal and the clock signal may be associated with the activation/deactivation of the selection circuitry of the apparatus in order to enable selection of an input signal such as a scan input signal (SI) or a data input signal (D). For example, while the clock signal has a logic low value and the enable signal SE has a logic high value, the input signal SI is selected. While the clock signal has a logic low value and the enable signal SE has a logic low value, the input signal D is selected. The step 802 may be associated with or performed by the selection circuitry 104 of FIG. 6.

The method 800 also includes generating a pair of intermediate signals based on selection of the input signal, at 804. For example, the enable signal (SE) and the clock signal (CLK) may enable selection of an input signal. Upon selection of the input signal (e.g., input signal D), the selection circuitry 104 of the apparatus 602 of FIG. 6, may generate the pair of intermediate signals (e.g., signals nqhi and nqlo) associated with the selected input signal as described herein. The selection circuitry 104 may drive the pair of intermediate signals for receipt by the resolution circuitry 606 (e.g. of FIGS. 6-7). The step 804 may be associated with or performed by the selection circuitry 104 of FIG. 6.

The method 800 also includes providing differential signals based on the pair of intermediate signals, where providing the differential signals includes resolving meta-stability associated with the differential signals, at 806. For example, completion clock signals (e.g., signals sclk and nsclk) may be received by the resolution circuitry 606 (e.g. of FIGS. 6-7) of the apparatus 602 of FIG. 6, as described herein. The resolution circuitry 606 may receive the pair of intermediate signals (e.g., signals nqhi and nqlo) and based on a falling edge of the completion clock signal sclk, the resolution circuitry 606 may provide the differential signals (e.g., signals qhi, nqhi, qlo, and nqlo). Furthermore, the resolution circuitry 606 may utilize tuned latches to resolve any meta-stability associated with the differential signals so as to provide the differential signals with stable states. The step 806 may be associated with or performed by the resolution circuitry 606 of FIGS. 6-7.

The method 800 also includes generating conflict signals based on the detection of a conflict condition associate with the differential signals, at 808. For example, conflict detection circuitry 612 (e.g., of FIGS. 6-7) may be configured to receive the differential signals (e.g., qlo and nqhi), the data input signal (e.g., signal D), and the completion clock signal (e.g., sclk). The conflict detection circuitry 612 may further be configured to detect a conflict condition associated with the differential signals nqhi and qlo and may generate the conflict signals based on the conflict condition, the completion clock signal sclk, and the input signal D. The conflict detection circuitry 612 may provide the conflict signals (ncon-hi and ncon-lo) to the arbiter circuitry 608 for biasing the arbiter circuitry 608. The step 808 may be associated with or performed by the conflict detection circuitry 612 of FIGS. 6-7.

The method 800 also includes generating intermediate output signals based on the conflict signals and a determination of a dominant value associated with the differential signals, at 810. For example, the arbiter circuitry 608 (e.g., of FIGS. 6-7), may receive the differential signals generate by the resolution circuitry 606 and may receive the conflict signals generated by the conflict detection circuitry 612. Based on the logic values of the differential signals and the conflict signals, the arbiter circuitry may determine a dominant value associated with the differential signals and may generate the intermediate output signals (e.g., signals m0 and nm0). The determination may include evaluating state conditions that include a high condition, a low condition, a preferred-high condition, a preferred-low condition, and a conflict condition. The conflict condition may be indicated to the arbiter circuitry 608 by the conflict signals (e.g., signals con-hi and con-lo). The step 810 may be associated with the operations describe for the arbiter circuitry 608 of FIGS. 6-7. For example, in a particular embodiment, the step 810 may be associated with the arbiter circuitry 608 of FIGS. 6-7 having a conflict differential amplifier (e.g., the amplifier 727 of FIG. 7) configured to be enabled and to operate based on a rising clock edge of the clock signal (e.g., CLK) received by the arbiter circuitry 608. Additionally, the step 810 may be associated with the arbiter circuitry 608 of FIGS. 6-7 having a completion clock circuitry 728 for the generation of the completion clock signals. Furthermore, the step 810 may be associated with or performed by the arbiter circuitry 608 of FIGS. 6-7 that may drive the generated intermediate output signals (e.g., signals m0 and nm0) to be received by the latching circuitry 110 of FIGS. 16-7.

The method 800 also includes generating an output signal based on the intermediate output signal where the output signal is synchronous to the clock signal of the second clock domain, at 812. For example, the intermediate output signals (e.g., signals m0 and nm0) generated by the arbiter circuitry 608 may be received by latching circuitry 610 (e.g., of FIGS. 6-7) of an apparatus (e.g., the apparatus 602 of FIG. 6) described herein. The latching circuitry 610 may generate an output signal (e.g., output signal Q) based on the intermediate output signals (e.g., signals m0 and nm0). The latching circuitry 610 may generate the output signal (e.g., signal Q) that is synchronous with the clock signal (e.g., signal CLK) of the second clock domain (e.g., a clock domain of the apparatus 602 of FIG. 6). The step 812 may be associated with the operations describe for the latching circuitry 610 of FIGS. 6-7. For example, in a particular embodiment, the step 812 may be associated with or performed by the latching circuitry 610 configured to generate feedback signals (e.g., signals bq and nq) based on the intermediate output signals (e.g., signals m0 and nm0).

The method 800 also includes maintaining a logic low value for the intermediate output signals having an intended logic low value, at 814. For example, the keeper circuitry 614 (e.g., of FIGS. 6-7) of an apparatus (e.g., the apparatus 602 of FIG. 6) may be configured to receive the feedback signals (e.g., signals bq and nq) and the completion clock signal (e.g., signal sclk) to enable the maintenance of a logic low value at an intermediate output signal (e.g., either signal m0 or nm0) after generation of the intermediate output signal by the arbiter circuitry 608. To illustrate, if the generated intermediate output signal (e.g., m0) has an intended logic low value, the drifting of its logic low value to a logic high value may upset the latching circuitry 610 and disturb the logic value of the output signal (Q). The keeper circuitry 614 may maintain a logic low value for an intermediate output signal that has an intended logic low value. The step 814 may be associated with the operations describe for the latching circuitry 610 of FIGS. 6-7. For example, in a particular embodiment, the step 814 may be associated with or performed by the keeper circuitry 610 configured to mitigate any disturbance of output signal (Q) due to the potential drifting of the logic value of an intermediate output signal (e.g., m0).

It is to be understood that the method 800 may accommodate other operational cases associated with synchronization of an input signal of a first clock domain to an output signal synchronized to a second clock domain (e.g., a clock domain of the apparatus 602). The method 800 may be associated with the potential outcomes described in reference to table T100. The method 800 may be associated with the operations, characteristics, and/or results described for the apparatus 602 of FIG. 6 and their components (e.g., the block, logic, and transistor level components of FIG. 7). For example, the method 800 may be associated with the mitigation of any potential meta-stability associated with or arising from elements or conditions of the arbiter circuitry 608. Furthermore, the method 800 may be associated with the arbiter circuitry 608 that enables the processing of potential state conditions (e.g., high, low, and conflict conditions) while reducing potential meta-stability for the generation of the intermediate output signals (e.g., signals m0 and nm0) with reduce latency periods. Use of the method 800 may improve signal stability as part of the synchronization of signals to other clock domains (e.g., higher frequency clock domains) while reducing synchronization latencies and minimizing performance penalties associated with signal synchronization.

Figure 9:
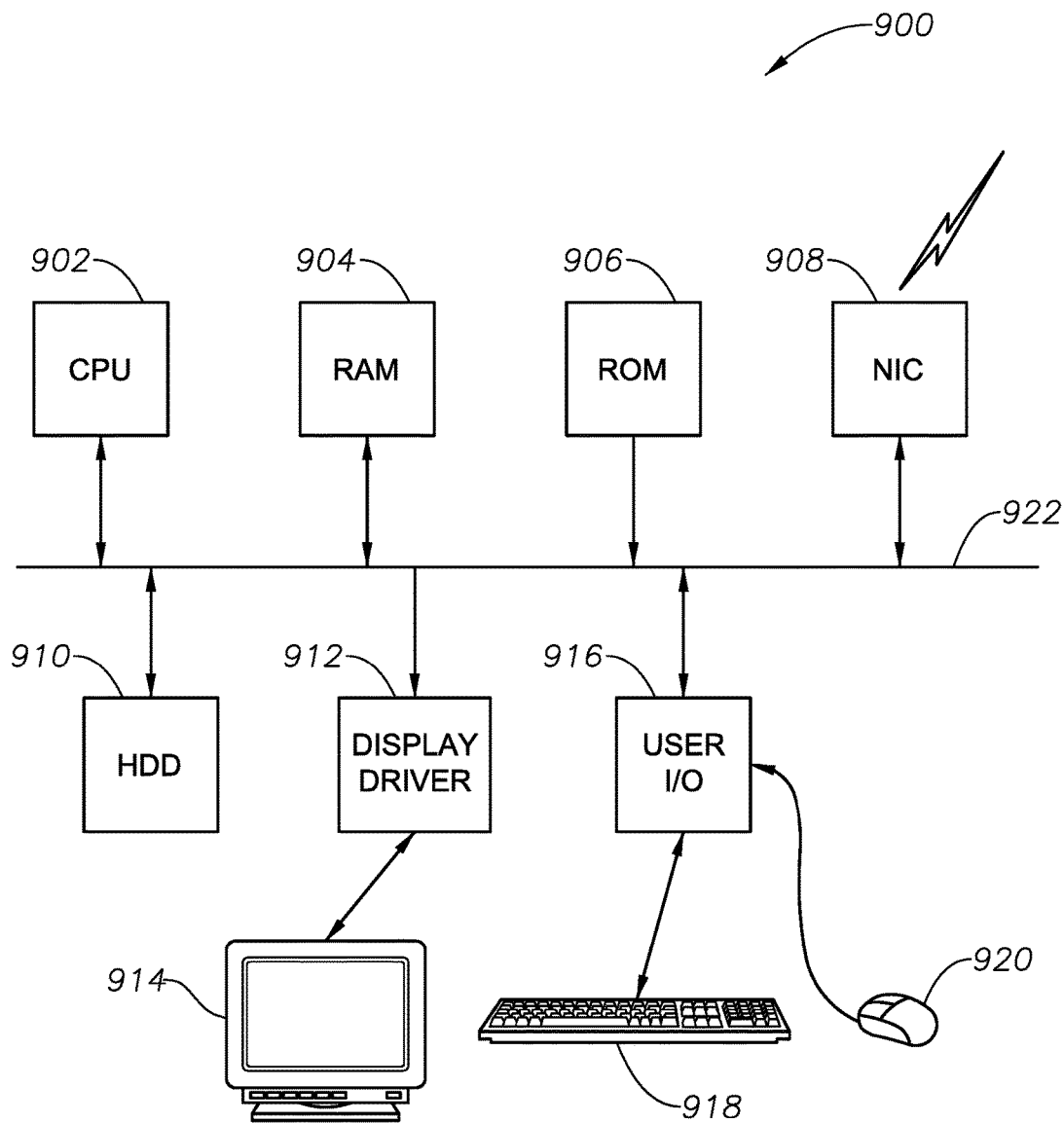
FIG. 9 illustrates a block diagram of a computer system in accordance with implementations of the present techniques, apparatuses, systems, and methods described herein.

Referring to FIG. 9, a block diagram schematically illustrating a general purpose computer of the type that may be used to implement the above described apparatuses, methods and techniques is shown and generally designated 900. The general purpose computer 900 includes a central processing unit 902, a random access memory 904, a read-only memory 906, a network interface card 908, a hard disk drive 910, a display driver 912, a user input/output circuit 916 with a keyboard 918 and mouse 920, and a monitor 914 all connected via a common bus 922. In operation the central processing unit 902 will execute computer program instructions that may be stored in one or more of the random access memory 904, the read-only memory 906 and the hard disk drive 910, or dynamically downloaded via the network interface card 908. The results of the processing performed may be displayed to a user via the display driver 912 and the monitor 914. User inputs for controlling the operation of the general purpose computer 900 may be received via the user input/output circuit 916 from the keyboard 918 or the mouse 920. It will be appreciated that the computer program could be written in a variety of different computer languages. The computer program may be stored and distributed on a recording medium or dynamically downloaded to the general purpose computer 900.

When operating under control of an appropriate computer program, the general purpose computer 900 can include the above described apparatuses (e.g., the apparatuses 102, 202, 302, and 602 of FIGS. 1, 2, 3, and 6, respectively), the above described components (e.g., the components 402 and 702 of FIGS. 4, and 7, respectively) operate according to the above described outcomes (e.g., the outcomes of table T100), and perform the above described methods and techniques (e.g., the methods 500 and/or 800 of FIGS. 5 and 8, respectively) and can be considered to form a particular apparatus for performing the above described methods and techniques. For example, the particular apparatus may be part of a system that includes devices and signals operating according to a first clock domain that is asynchronous to a second clock domain. The particular apparatus may operate within the second clock domain and/or may be one or more components of the system. The particular apparatus may enable an input signal of the first clock domain to be synchronized to the clock signal of the second clock domain. The architecture of the general purpose computer 900 could vary considerably, and FIG. 9 is only one example Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope of the invention as defined by the appended claims. As non-limiting examples, the invention describe herein may have other embodiments that may have operations based on opposite clock edges of a clock signal, that may provide an inverted output, or that may utilize an asynchronous set condition or a reset condition. Furthermore, various combinations of the features of the dependent claims could be made with the features of the independent claims without departing from the scope of the present invention.

What is claimed is:

1. An apparatus for synchronizing an input signal that is asynchronous to a clock signal received by the apparatus, the apparatus comprising:
    selection circuitry configured to select the input signal and to generate a pair of intermediate signals associated with the selected input signal;
    resolution circuitry configured to provide differential signals based on the pair of intermediate signals and to resolve meta-stability associated with the differential signals;
    arbiter circuitry configured to determine a dominant value associated with the differential signals and to generate an intermediate output signal based on the determination; and
    latching circuitry configured to generate an output signal based on the intermediate output signal.

2. The apparatus of claim 1, wherein the resolution circuitry comprises:
    a first latch tuned to generate a logical high value associated with the differential signals; and
    a second latch tuned to generate a logical low value associated with the differential signals.

3. The apparatus of claim 2, wherein the first latch and the second latch are enabled based on a falling edge of the clock signal received by the resolution circuitry.

4. The apparatus of claim 2, wherein the first latch comprises a first inverter and a first tri-state inverter, and wherein the second latch comprises a second inverter and a second tri-state inverter.

5. The apparatus of claim 4, wherein the first inverter comprises:
    a PMOS transistor that is sized larger than a PMOS transistor of the first tri-state inverter; and
    an NMOS transistor that is sized smaller than an NMOS transistor of the first tri-state inverter.

6. The apparatus of claim 4, wherein the second inverter comprises:
    a PMOS transistor that is sized smaller than a PMOS transistor of the second tri-state inverter; and
    an NMOS transistor that is sized larger than an NMOS transistor of the second tri-state inverter.

7. The apparatus of claim 1, wherein the arbiter circuitry comprises a differential amplifier configured to receive the differential signals, the differential amplifier comprising a first pair of complementary transistors, a second pair of complementary transistors, a third pair of complementary transistors, and a fourth pair of complementary transistors.

8. The apparatus of claim 7, wherein the first pair and second pair of complementary transistors share a first common node, and wherein the third pair and fourth pair of complementary transistors share a second common node.

9. The apparatus of claim 1, wherein determining the dominant value includes evaluating state conditions associated with the differential signals.

10. The apparatus of claim 9, wherein the state conditions include a high condition, a low condition, a preferred-high condition, a preferred-low condition, and a conflict condition.

11. The apparatus of claim 1, wherein determining the dominant value is based on a resolution time associated with the resolution circuitry.

12. The apparatus of claim 1, wherein selecting the input signal is based on an enable signal and a clock signal received by the apparatus.

13. The apparatus of claim 1, wherein the arbiter circuitry comprises a latching differential amplifier configured to be enabled based on a rising edge of the clock signal received by the arbiter circuitry.

14. The apparatus of claim 13, wherein the latching circuitry is enabled based on a delayed signal associated with the clock signal received by the apparatus.

15. The apparatus of claim 1, further comprising:
conflict detection circuitry configured to generate conflict signals based on a conflict state condition detected by the conflict detection circuitry; and
keeper circuitry configured to maintain the intermediate output signal at a logic low value after generation of the intermediate output signal by the arbiter circuitry,
wherein the intermediate output signal includes differential output signals.

16. The apparatus of claim 15, wherein the arbiter circuitry comprises:
a conflict differential amplifier configured to receive the conflict signals; and
completion clock circuitry configured to generate a second clock signal based on the differential output signals and the clock signal received by the arbiter circuitry.

17. The apparatus of claim 16, wherein the latching circuitry comprises a set-reset latch configured to provide feedback signals to the keeper circuitry.

18. The apparatus of claim 1, wherein the apparatus is part of a standard cell library of a process technology, and wherein the process technology includes a FinFET compact process for 16 nm or smaller process geometries.

19. A method for synchronizing an input signal of a first clock domain that is asynchronous to a clock signal of a second clock domain, the method comprising:
generating a pair of intermediate signals based on selection of the input signal;
providing differential signals based on the pair of intermediate signals, wherein providing the differential signals includes resolving meta-stability associated with the differential signals;
generating an intermediate output signal based on determining a dominant value associated with the differential signals; and
generating an output signal based on the intermediate output signal.

20. A system for synchronizing an input signal of a first clock domain that is asynchronous to a clock signal of a second clock domain, the system comprising:
means for generating a pair of intermediate signals, wherein the means for generating the pair of intermediate signals enables selection of the input signal;
means for providing differential signals based on the pair of intermediate signals, wherein the means for providing the differential signals resolves meta-stability associated with the differential signals;
means for generating an intermediate output signal based on the means for generating the intermediate output signal determining a dominant value associated with the differential signals; and
means for generating an output signal based on the intermediate output signal.

* * * * *